(12) United States Patent
Bok et al.

(10) Patent No.: US 12,156,422 B2
(45) Date of Patent: Nov. 26, 2024

(54) DISPLAY PANEL

(71) Applicant: Samsung Display Co., Ltd., Yongin-Si (KR)

(72) Inventors: Seunglyong Bok, Yongin-si (KR); Jeongho Lee, Yongin-si (KR); Youngran Son, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 434 days.

(21) Appl. No.: 17/565,135

(22) Filed: Dec. 29, 2021

(65) Prior Publication Data

US 2022/0209187 A1 Jun. 30, 2022

(30) Foreign Application Priority Data

Dec. 30, 2020 (KR) .................. 10-2020-0188060

(51) Int. Cl.
*H10K 50/844* (2023.01)
*H10K 59/131* (2023.01)

(52) U.S. Cl.
CPC ......... *H10K 50/844* (2023.02); *H10K 59/131* (2023.02)

(58) Field of Classification Search
CPC ............................ H10K 50/844; H10K 59/131
See application file for complete search history.

(56) References Cited

U.S. PATENT DOCUMENTS

| | | | |
|---|---|---|---|
| 10,768,742 B2 | 9/2020 | Rhe et al. | |
| 10,873,053 B2 | 12/2020 | Sung et al. | |
| 10,916,588 B2 * | 2/2021 | Kang | H10K 50/82 |
| 2020/0235180 A1 | 7/2020 | Park et al. | |
| 2020/0303677 A1 | 9/2020 | Lee et al. | |

FOREIGN PATENT DOCUMENTS

| | | |
|---|---|---|
| CN | 111293148 A | 6/2020 |
| KR | 10-2019-0047549 A | 5/2019 |
| KR | 10-2020-0026381 A | 3/2020 |
| KR | 10-2020-0090595 A | 7/2020 |
| KR | 20200113092 A | 10/2020 |

* cited by examiner

*Primary Examiner* — Mary Ellen Bowman
(74) *Attorney, Agent, or Firm* — Innovation Counsel LLP

(57) ABSTRACT

A display panel includes a substrate including a display area and a middle area, wherein an opening is defined in the substrate, the display area surrounds the opening, and the middle area is disposed between the opening and the display area; a light-emitting device in the display area, including a pixel electrode, an opposite electrode, and an intermediate layer between the pixel electrode and the opposite electrode; an encapsulation layer covering the light-emitting device, and including at least one inorganic encapsulation layer; a first groove in the middle area on the substrate; and a second groove in the middle area, having an undercut shape that is concave in a thickness direction of a multi-layered film in the substrate.

20 Claims, 23 Drawing Sheets

DISPLAY PANEL

CROSS-REFERENCE TO RELATED APPLICATION

This application is based on and claims priority under 35 U.S.C. § 119 to Korean Patent Application No. 10-2020-0188060, filed on Dec. 30, 2020, in the Korean Intellectual Property Office, the disclosure of which is incorporated by reference herein in its entirety.

BACKGROUND

1. Field

One or more embodiments of the disclosure relate to a display panel, and more particularly, to a display panel including an opening area.

2. Description of the Related Art

Display apparatuses have been used for various purposes. In addition, because the thickness and weight of the display apparatuses have been reduced, the utilization range of the display apparatuses has increased.

In a display apparatus, various functions added to or linked to a display apparatus are being added while increasing a display area. As a method of adding various functions while increasing an area, research into a display apparatus having an area for providing other various functions than an image display in a display area has been continuously conducted.

SUMMARY

However, in a display panel according to the related art, defects caused by moisture infiltration may occur.

One or more embodiments include a display panel having an improved moisture permeability prevention performance. However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to an embodiment, a display panel includes a substrate including an opening, a display area surrounding the opening, and a middle area between the opening and the display area, a light-emitting device in the display area, the light-emitting device including a pixel electrode, an opposite electrode, and an intermediate layer between the pixel electrode and the opposite electrode, an encapsulation layer covering the light-emitting device, the encapsulation layer including at least one inorganic encapsulation layer, a first groove in the middle area, the first groove being on the substrate, and a second groove in the middle area, the second groove having an undercut shape that is concave in a thickness direction of a multi-layered film in the substrate.

The first groove may include a 1-1st hole in an inorganic insulating layer on the substrate and a 1-2nd hole in an organic insulating layer on the inorganic insulating layer, wherein the 1-2nd hole may be connected to the 1-1st hole.

The first groove may include a first tip that is a protrusion from a metal pattern layer on the organic insulating layer toward a center of the first groove.

An organic material layer included in the intermediate layer or the opposite electrode may be disconnected by the first tip.

The at least one inorganic encapsulation layer may continuously cover an inner surface and a lower surface of the metal pattern layer and an inner surface of the organic insulating layer.

The first tip may have a multi-layered structure, in which a first layer, a second layer, and a third layer are sequentially stacked, and a concave portion that is obtained by denting the second layer in a direction away from the center of the first groove, and the organic material layer included in the intermediate layer or the opposite electrode may be disconnected by the multi-layered structure.

The display panel may include a lower layer under the first groove, the lower layer having an upper surface corresponding to a bottom surface of the first groove.

The display panel may further include metal dummy stacks at opposite sides of the first groove based on a line that passes through the center of the first groove and is perpendicular to an upper surface of the substrate, the metal dummy stacks may each include one or more metal layers stacked with an insulating layer therebetween.

The multi-layered film included in the substrate may include a base layer and a barrier layer on the base layer.

The second groove may include a 2-1st hole or a 2-1st recess in the base layer, and a 2-2nd hole in the barrier layer, and the 2-2nd hole may be connected to the 2-1st hole or the 2-1st recess.

The second groove may include a second tip that is a protrusion from the barrier layer toward a center of the second groove.

An organic material layer included in the intermediate layer or the opposite electrode may be disconnected by the second tip.

The at least one inorganic encapsulation layer may continuously cover an inner surface and a lower surface of the barrier layer and an inner surface of the base layer.

The display panel may further include a disconnection portion in the middle area, the disconnection portion having at least one of a first stack structure, in which a 1-1st sub-layer, a 1-2nd sub-layer, and a 1-3rd sub-layer are sequentially stacked, and a second stack structure on the first stack structure, the second stack structure including a 2-1st sub-layer, a 2-2nd sub-layer, and a 2-3rd sub-layer sequentially stacked, wherein an organic material layer included in the intermediate layer or the opposite electrode may be disconnected by the disconnection portion.

The first stack structure may have a first concave portion formed by denting the 1-2nd sub-layer toward a center thereof, and the second stack structure may have a second concave portion formed by denting the 2-2nd sub-layer toward a center thereof.

The display panel may include a thin film transistor on the substrate, the thin film transistor including a semiconductor layer, a gate electrode overlapping the semiconductor layer, and a source electrode and a drain electrode electrically connected to the semiconductor layer, wherein each of the source electrode and the drain electrode may have a structure, in which a layer having a material same as a material in the 1-1st sub-layer, a layer having a material same as a material in the 1-2nd sub-layer, and a layer having a material same as a material in the 1-3rd sub-layer are sequentially stacked.

The display panel may further include a contact metal layer on the thin film transistor, the contact metal layer being electrically connected to the source electrode or the drain electrode, wherein the contact metal layer has a structure, in which a layer having a material same as a material in the 2-1st sub-layer, a layer having a material same as a material in the 2-2nd sub-layer, and a layer having a material same as a material in the 2-3rd sub-layer may be sequentially stacked.

The disconnection portion may further include a third stack structure on the second stack structure, the third stack structure including a 3-1st sub-layer, a 3-2nd sub-layer, and 3-3rd sub-layer sequentially stacked.

The first stack structure may have a first concave portion formed by denting the 1-2nd sub-layer toward a center thereof, the second stack structure may have a second concave portion formed by denting the 2-2nd sub-layer toward a center thereof, and the third stack structure may have a third concave portion formed by denting the 3-2nd sub-layer toward a center thereof.

The pixel electrode may have a structure, in which a layer having a material same as a material in the 3-1st sub-layer, a layer having a material same as a material in the 3-2nd sub-layer, and a layer having a material same as a material in the 3-3rd sub-layer may be sequentially stacked.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
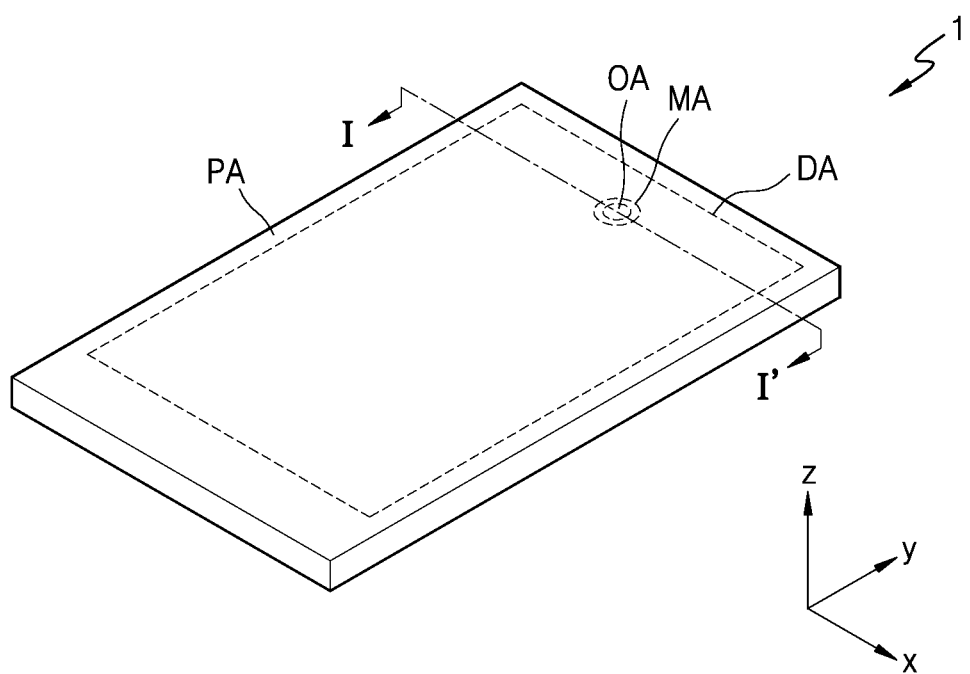
FIG. 1 is a perspective view showing a region of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The embodiments will be described below in more detail with reference to the accompanying drawings. Those components that are the same or are in correspondence are rendered the same reference numeral regardless of the figure number, and redundant explanations are omitted.

FIG. 1 is a perspective view showing a region of a display apparatus 1 according to an embodiment.

Referring to FIG. 1, the display apparatus 1 according to an embodiment may include an opening area OA (or first area) and a display area DA (or second area) surrounding the opening area OA. A plurality of pixels may be in the display area DA, and the display area DA may display images via the pixels. The opening area OA may be entirely surrounded by the display area DA.

A middle area MA (or third area) may be between the opening area OA and the display area DA. The middle area MA is a non-display area in which the pixels are not provided, and may include wirings detouring the opening area OA. A peripheral area PA (or fourth area) surrounding the display area DA may be also a non-display area in which the pixels are not provided like the middle area MA, and various kinds of wirings and internal circuits may be in the peripheral area PA.

In FIG. 1, the opening area OA is at a center portion of the display area DA in a width direction (e.g., x-direction) of the display apparatus 1, but in another embodiment, the opening area OA may be offset to left or right side in the width direction of the display apparatus 1. Alternatively, the opening area OA may be at various locations, e.g., an upper side, an intermediate side, or a lower side in a lengthwise direction (e.g., y-direction) of the display apparatus 1.

FIG. 1 shows the display apparatus 1 includes one opening area OA, but in another embodiment, the display apparatus 1 may include a plurality of opening areas OA.

Figure 2:
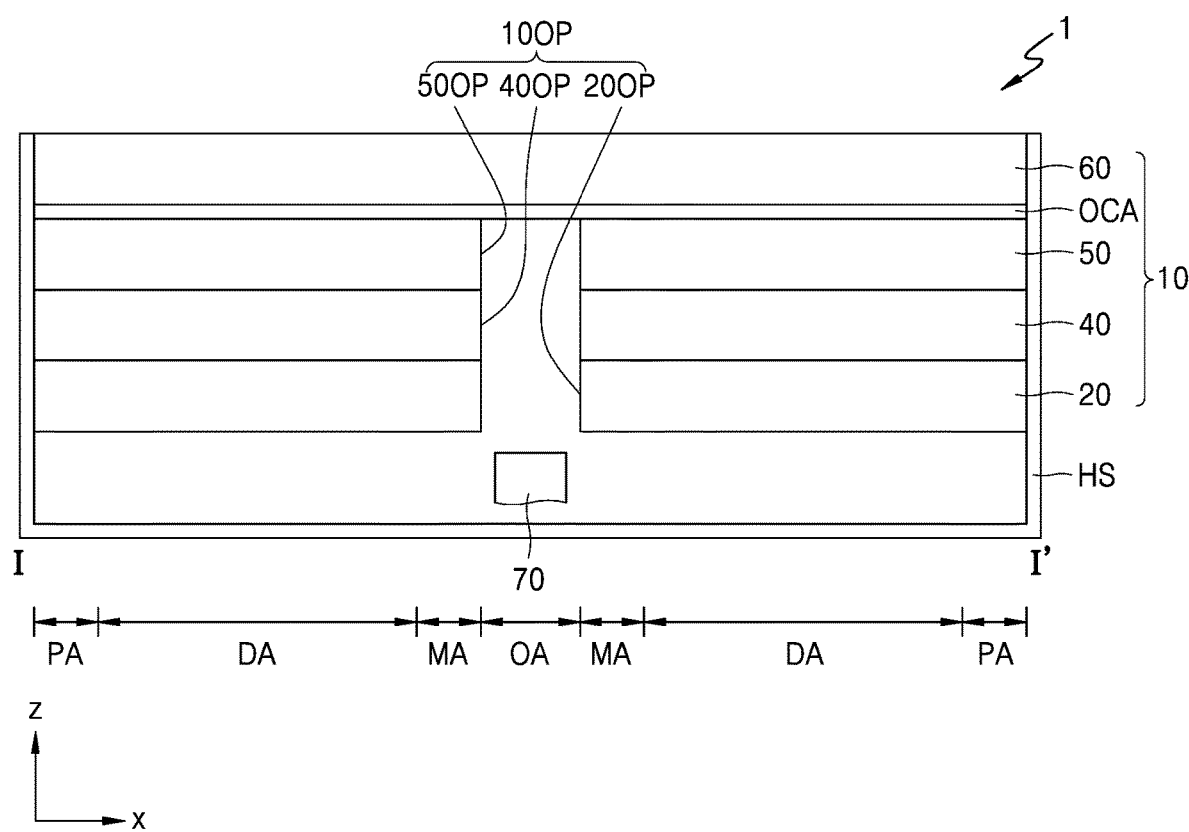
FIG. 2 is a cross-sectional view showing a region of the display apparatus of FIG. 1.

FIG. 2 is a cross-sectional view showing a region of the display apparatus 1 of FIG. 1. FIG. 2 is a cross-sectional view of the display apparatus 1 taken along line I-I' of FIG. 1.

Referring to FIG. 2, the display apparatus 1 may include a display panel 10 and a component 70 provided in the opening area OA of the display panel 10. In an embodiment, the display panel 10 and the component 70 may be accommodated in a housing HS. In another embodiment, the housing HS may be omitted.

The display panel 10 may include a display element layer 20, an input sensing layer 40, an optical functional layer 50, and a cover window 60.

The display element layer 20 may include display elements emitting light for displaying images. The display element may include a light-emitting device. In an embodiment, the light-emitting device may include an organic light-emitting diode including an organic emission layer. In another embodiment, the light-emitting device may include an inorganic light-emitting diode including an inorganic material. The inorganic light-emitting diode may include a PN diode including inorganic material semiconductor-based materials. In another embodiment, the light-emitting device may include quantum dots as an emission layer. Hereinafter, for convenience of description, a case in which the light-emitting device includes an organic light-emitting diode will be described below.

The input sensing layer 40 may obtain coordinate information generated according to an external input, e.g., a touch event. The input sensing layer 40 may include a sensing electrode and trace lines connected to the sensing electrode. The input sensing layer 40 may be on the display element layer 20. The input sensing layer 40 may sense an external input by a mutual capacitance method and/or a self-capacitance method, but is not limited thereto.

The input sensing layer 40 may be directly on the display element layer 20 or may be separately manufactured and then coupled to the display element layer 20 via an adhesive layer such as an optically clear adhesive. For example, the input sensing layer 40 may be obtained successively after the process of arranging the display element layer 20. In another embodiment, the adhesive layer between the input sensing layer 40 and the display element layer 20 may be omitted. FIG. 2 shows that the input sensing layer 40 is between the display element layer 20 and the optical functional layer 50, but in another embodiment, the input sensing layer 40 may be on the optical functional layer 50.

The optical functional layer 50 may include an anti-reflection layer. The anti-reflection layer may reduce a reflectivity of light incident to the display panel 10 from outside (external light) via the cover window 60. The anti-reflection layer may include a retarder and a polarizer. In another embodiment, the anti-reflection layer may include a black matrix and color filters. The color filters may be arranged taking into account a color of light emitted from each of the light-emitting devices in the display element layer 20.

In order to improve a transmittance of the opening area OA, an opening 10OP that penetrates through some of layers of the display panel 10 is defined in the display panel 10. The opening 10OP may include first, second, and third openings 20OP, 40OP, and 50OP that respectively penetrate through the display element layer 20, the input sensing layer 40, and the optical functional layer 50. That is, the first opening 20OP is defined in the display element layer 20, the second opening 40OP is defined in the input sensing layer 40, and the third opening 50OP is defined in the optical functional layer 50. The first opening 20OP of the display element layer 20, the second opening 40OP of the input sensing layer 40, and the third opening 50OP of the optical functional layer 50 may overlap one another and configure one opening 10OP of the display panel 10.

The cover window 60 may be disposed on the optical functional layer 50. The cover window 60 may be coupled to the optical functional layer 50 via an adhesive layer such as an optical clear adhesive (OCA) provided between the cover window 60 and the optical functional layer 50. The cover window 60 may include a glass material.

The opening area OA may be a kind of component area (e.g., a sensor region, a camera region, a speaker region, etc.) in which the component 70 for adding various functions to the display apparatus 1 is located. That is, the component 70 overlaps the opening area OA.

The component 70 may include an electronic element. For example, the component 70 may include an electronic element using light or sound. For example, the electronic element may include a sensor using light such as an IR sensor, a camera capturing an image by receiving light, a sensor for outputting and sensing light or sound to measure a distance or recognize a fingerprint, a small-sized lamp illuminating light, a speaker for outputting sound, etc. The electronic element using light may use light of various wavelength bands such as visible light, infrared rays, ultraviolet rays, etc. The opening area OA may correspond to a transmission area through which light and/or sound output from the component 70 or proceeding towards the component 70 may pass from the outside.

Figure 3:
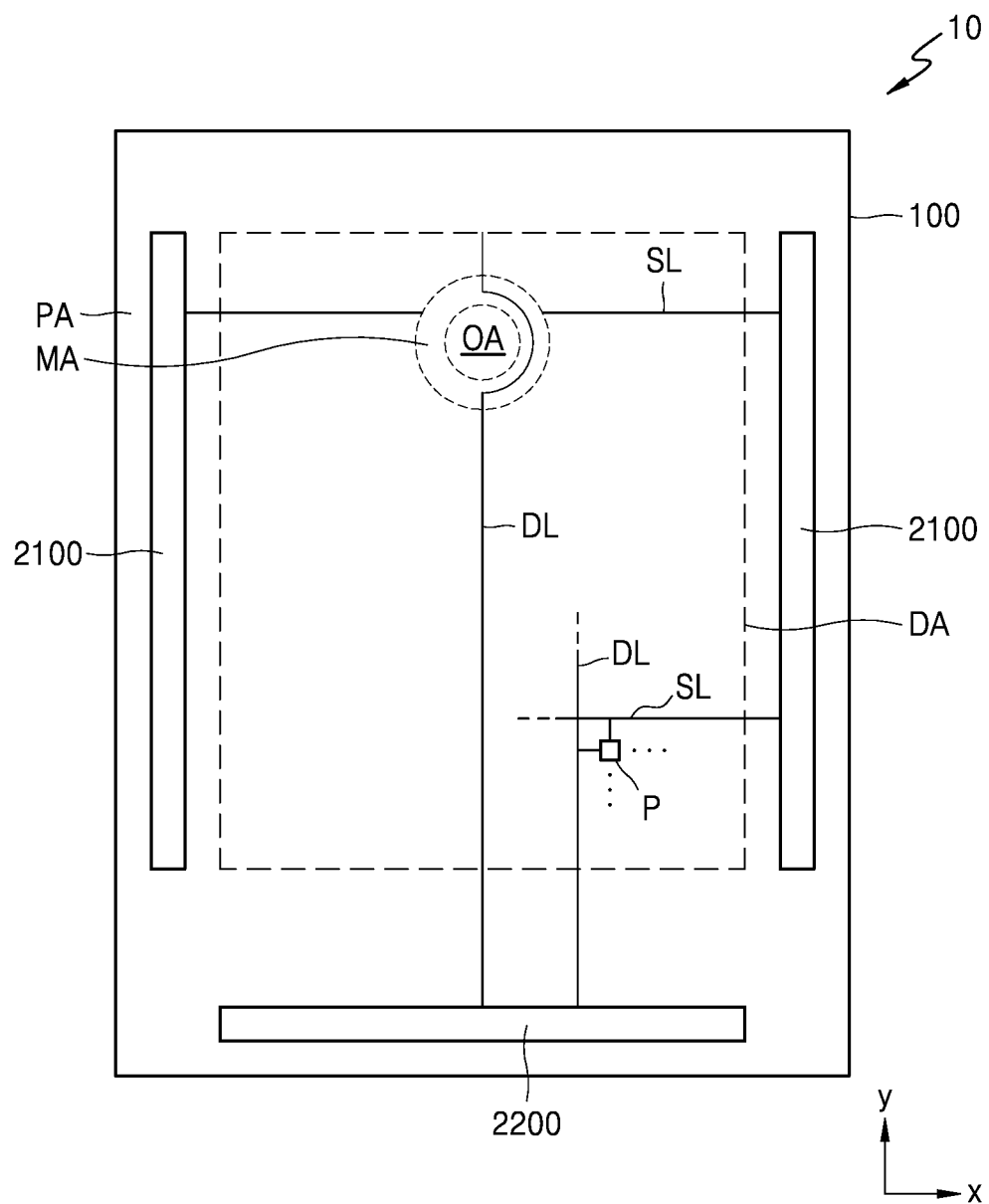
FIG. 3 is a plan view partially showing a region of a display panel according to an embodiment.

FIG. 3 is a plan view partially showing a region of the display panel 10 according to an embodiment.

Referring to FIG. 3, the display panel 10 may include the opening area OA, the display area DA, the middle area MA, and the peripheral area PA.

The display panel 10 may include a plurality of pixels P in the display area DA, and may display images by using light emitted from each of the pixels P. Each of the pixels P may emit red light, green light, or blue light. The light-emitting device of each pixel may be electrically connected to a scan line SL and a data line DL.

The peripheral area PA may include a scan driver 2100 for providing each pixel P with a scan signal, a data driver 2200 for providing each pixel P with a data signal, and a main power line (not shown) and a second main power line (not shown) for supplying first and second power voltages. The scan drivers 2100 may be disposed at opposite sides with respect to the display area DA. In this case, the pixels P at a left side of the opening area OA may be connected to the scan driver 2100 at the left side, and the pixels P at a right side of the opening area OA may be connected to the scan driver 2100 at the right side.

The middle area MA may surround the opening area OA. The middle area MA is an area in which the display element such as a light-emitting device emitting light is not arranged, and signal lines providing signals to the pixels P around the first area OA may pass through the middle area MA. For example, the data lines DL and/or the scan lines SL cross the display area DA, and some of the data lines DL and/or the scan lines SL may detour an edge of the opening area OA of the display panel 10, which is provided in the opening area OA, in the middle area MA. In an embodiment, FIG. 3 shows that the data lines DL cross the display area DA in the y-direction, and some of the data lines DL detour so as to partially surround the opening area OA in the middle area MA. The scan lines SL cross the display area DA in the x-direction, and may be spaced apart from one another with the opening area OA therebetween.

FIG. 3 shows that the data driver 2200 is adjacent to one side of the substrate 100, but in another embodiment, the data driver 2200 may be on a printed circuit board that is electrically connected to a pad at one side of the display panel 10. The circuit board may be flexible, and may be partially curved to be under the rear surface of the substrate 100.

Figure 4:
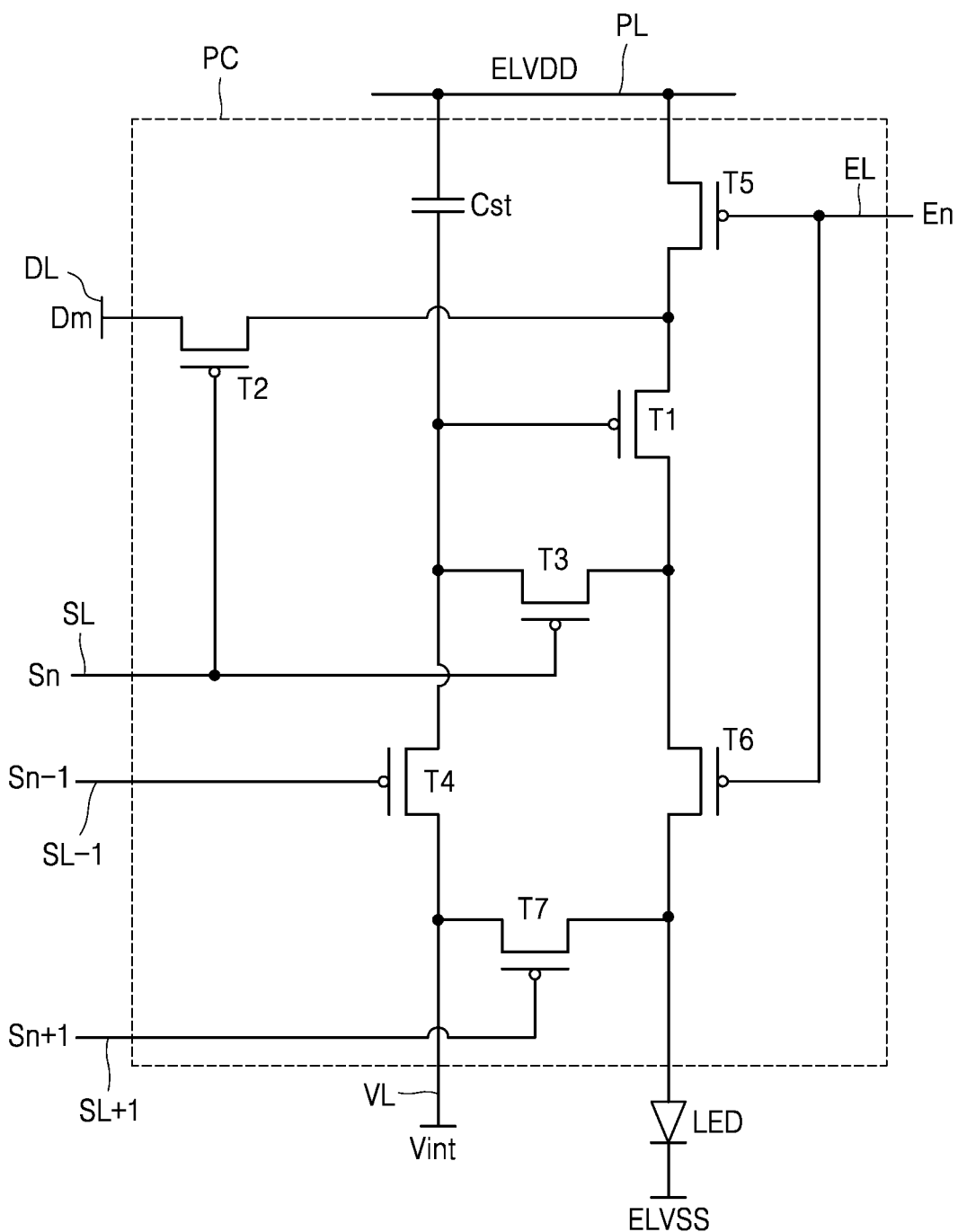
FIG. 4 is an equivalent circuit diagram of one pixel in a display panel according to an embodiment.

FIG. 4 is an equivalent circuit diagram of one pixel in the display panel according to an embodiment.

Referring to FIG. 4, the pixel P described above with reference to FIG. 3 may emit light through a light-emitting device LED, and the light-emitting device may be electrically connected to a pixel circuit PC.

Also, the pixel circuit PC may include a first thin film transistor T1, a second thin film transistor T2, a third thin film transistor T3, a fourth thin film transistor T4, a fifth thin film transistor T5, a sixth thin film transistor T6, a seventh thin film transistor T7, and a storage capacitor Cst.

The second thin film transistor T2 is a switching thin film transistor and is connected to a scan line SL and a data line DL, and may be configured to transfer a data voltage (or data signal Dm) input from the data line DL to the first thin film transistor T1 based on a switching voltage (or switching signal Sn) input from the scan line SL. The storage capacitor Cst is connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor connected to the driving voltage line PL and the storage capacitor Cst and may control a driving current flowing in the light-emitting device LED from the driving voltage line PL, corresponding to the voltage value stored in the storage capacitor Cst. The light-emitting device LED may emit light having a predetermined luminance according to the driving current. An opposite electrode (e.g., a cathode) of the light-emitting device LED may receive supply of a second power voltage ELVSS.

The third thin film transistor T3 is a compensation thin film transistor and a gate electrode of the third thin film transistor T3 may be connected to the scan line SL. A source electrode (or drain electrode) of the third thin film transistor T3 may be connected to a drain electrode (or source electrode) of the first thin film transistor T1 and may be also connected to a pixel electrode of the light-emitting device LED via the sixth thin film transistor T6. The drain electrode (or source electrode) of the third thin film transistor T3 may be connected to one electrode of the storage capacitor Cst, the source electrode (or drain electrode) of the fourth thin film transistor T4 and the gate electrode of the first thin film transistor T1. The third thin film transistor T3 is turned on according to the scan signal Sn transferred through the scan line SL, and connects the gate electrode and the drain electrode of the first thin film transistor T1 to each other for diode-connecting the first thin film transistor T1.

The fourth thin film transistor T4 is an initialization thin film transistor, and a gate electrode of the fourth thin film transistor T4 may be connected to a previous scan line SL−1. The drain electrode (or source electrode) of the fourth thin film transistor T4 may be connected to the initialization voltage line VL. The source electrode (or drain electrode) of the fourth thin film transistor T4 may be connected to one electrode of the storage capacitor Cst, the drain electrode (or source electrode) of the third thin film transistor T3, and the gate electrode of the first thin film transistor T1. The fourth thin film transistor T4 is turned on according to a previous scan signal Sn-1 transferred through the previous scan line SL-1 to transfer an initialization voltage Vint to the gate electrode of the first thin film transistor T1 and perform an initialization operation for initializing a voltage at the gate electrode of the first thin film transistor T1.

The fifth thin film transistor T5 is an operation control thin film transistor, and a gate electrode thereof may be connected to an emission control line EL. The source electrode (or drain electrode) of the fifth thin film transistor T5 may be connected to the driving voltage line PL. The drain electrode (or source electrode) of the fifth thin film transistor T5 is connected to the source electrode (or drain electrode) of the first thin film transistor T1 or the drain electrode (or source electrode) of the second thin film transistor T2.

The sixth thin film transistor T6 is an emission control thin film transistor, and a gate electrode thereof may be connected to the emission control line EL. The source electrode (or drain electrode) of the sixth thin film transistor T6 may be connected to the drain electrode (or source electrode) of the first thin film transistor T1 and the source electrode (or drain electrode) of the third thin film transistor T3. The drain electrode (or source electrode) of the sixth thin film transistor T6 may be electrically connected to the pixel electrode of the light-emitting device LED. The fifth thin film transistor T5 and the sixth thin film transistor T6 are simultaneously turned on according to an emission control signal En transferred through the emission control line EL to transfer the driving voltage ELVDD to the light-emitting device LED, and a driving current flows through the light-emitting device LED.

The seventh thin film transistor T7 may be an initialization thin film transistor that initializes the pixel electrode of the light-emitting device LED. A gate electrode of the seventh thin film transistor T7 may be connected to a post scan line SL+1. A source electrode (or drain electrode) of the seventh thin film transistor T7 may be connected to the pixel electrode of the light-emitting device LED. The drain electrode (or source electrode) of the seventh thin film transistor T7 may be connected to the initialization voltage line VL. The seventh thin-film transistor T7 is turned on according to a post scan signal Sn+1 transferred through the post scan line SL+1 to initialize the pixel electrode of the light-emitting device LED.

In FIG. 4, the fourth thin film transistor T4 and the seventh thin film transistor T7 are respectively connected to the previous scan line SL−1 and the post scan line SL+1, but in another embodiment, the fourth thin film transistor T4 and the seventh thin film transistor T7 may be connected to the previous scan line SLn−1 to operate according to a previous scan signal Sn−1.

Another electrode of the storage capacitor Cst may be connected to the driving voltage line PL. One electrode of the storage capacitor Cst may be connected to the gate electrode of the first thin film transistor T1, the drain electrode (or source electrode) of the third thin film transistor T3, and the source electrode (or drain electrode) of the fourth thin film transistor T4.

An opposite electrode (e.g., a cathode) of the light-emitting device LED may receive a supply of the common voltage ELVSS. The light-emitting device LED emits light after receiving a driving current from the first thin film transistor T1.

Figure 5:
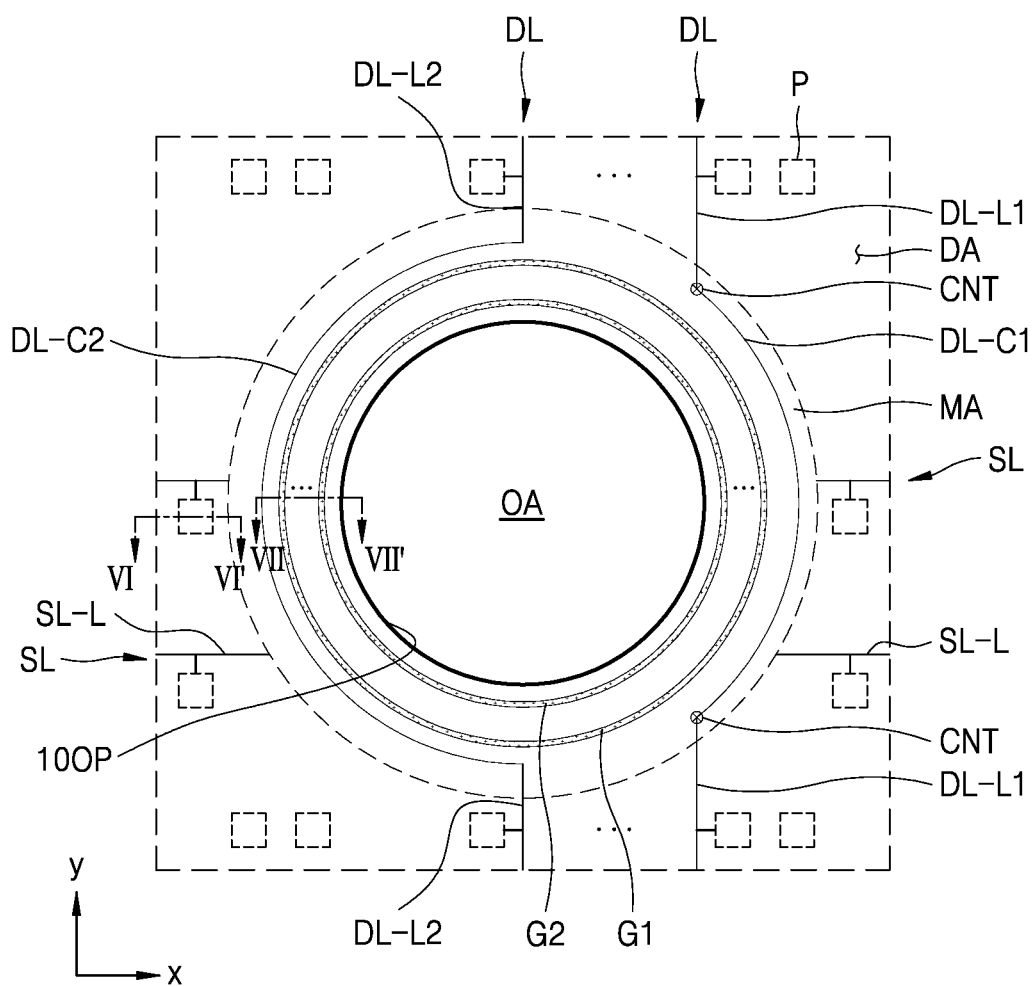
FIG. 5 is a plan view partially showing a region of a display panel according to an embodiment.

FIG. 5 is a plan view partially showing a region of a display panel according to an embodiment.

Referring to FIG. 5, the pixels P are in the display area DA. The middle area MA may be between the opening area OA and the display area DA. As described above with reference to FIGS. 3 and 4, each of the pixels P includes the light-emitting device and may emit red light, green light, or blue light emitted from the light-emitting device to outside.

From among the signal lines supplying signals to the pixel circuit connected to the light-emitting device of each pixel P, signal lines adjacent to the opening area OA may detour the opening area OA and/or the opening 10OP. Some of the data lines DL passing through the display area DA extend in the y-direction to provide data signals to the pixels P arranged above and under the opening area OA, and may detour along an edge of the opening area OA and/or the opening 10OP in the middle area MA.

A bypass portion DL-C1 of at least one data line DL from among the data lines DL may be at a different layer from an extending portion DL-L1 crossing the display area DA, and the bypass portion DL-C1 and the extending portion DL-L1 of the data line DL may be connected to each other via a contact hole CNT. A bypass portion DL-C2 of at least one of the data lines DL may be at the same layer as that of an extending portion DL-L2, and may be integrally formed with the extending portion DL-L2.

The scan line SL may be isolated or disconnected about the opening area OA. The scan line SL at the left side of the opening area OA may receive a signal from the scan driver 2100 at the left side of the display area DA as described above with reference to FIG. 3, and the scan line SL at the right side of the opening area OA may receive a signal from the scan driver 2100 at the right side of the display area DA shown in FIG. 3.

In the middle area MA, grooves may be disposed between the region that the data lines DL detour and the opening area OA. The grooves may prevent moisture from infiltrating through the opening area OA and damaging the light-emitting device. In detail, the grooves may disconnect (or isolate) a layer, through which the moisture may move, from among the layers on the substrate 100 (see FIG. 7), and thus, may prevent the moisture from infiltrating into the display area DA. For example, the grooves may disconnect at least a part of the organic material layer included in an intermediate layer 222 (see FIG. 7) that will be described later and/or an opposite electrode 223 (see FIG. 7).

Each of the first and second grooves G1 and G2 may have a closed loop shape surrounding the opening area OA in a plane view, and the first and second grooves G1 and G2 may be spaced apart from each other. In this regard, FIG. 5 shows that one first groove G1 and one second groove G2 surround the opening area OA, but one or more embodiments are not limited thereto. For example, two or more first grooves G1 and/or second grooves G2 may be disposed in the middle area MA. In addition, in FIG. 5, the second groove G2 is closer to the opening area OA than the first groove G1, and the first groove G1 surrounds the second groove G2, but arrangement order of the grooves is not restricted. For example, the first groove G1 may be closer to the opening area OA than the second groove G2, and the second groove G2 may surround the first groove G1. The first and second grooves G1 and G2 may have structures that are the same as or different from each other, and detailed descriptions about the structure of each of the first and second grooves G1 and G2 will be described later with reference to FIG. 7.

Figure 6:
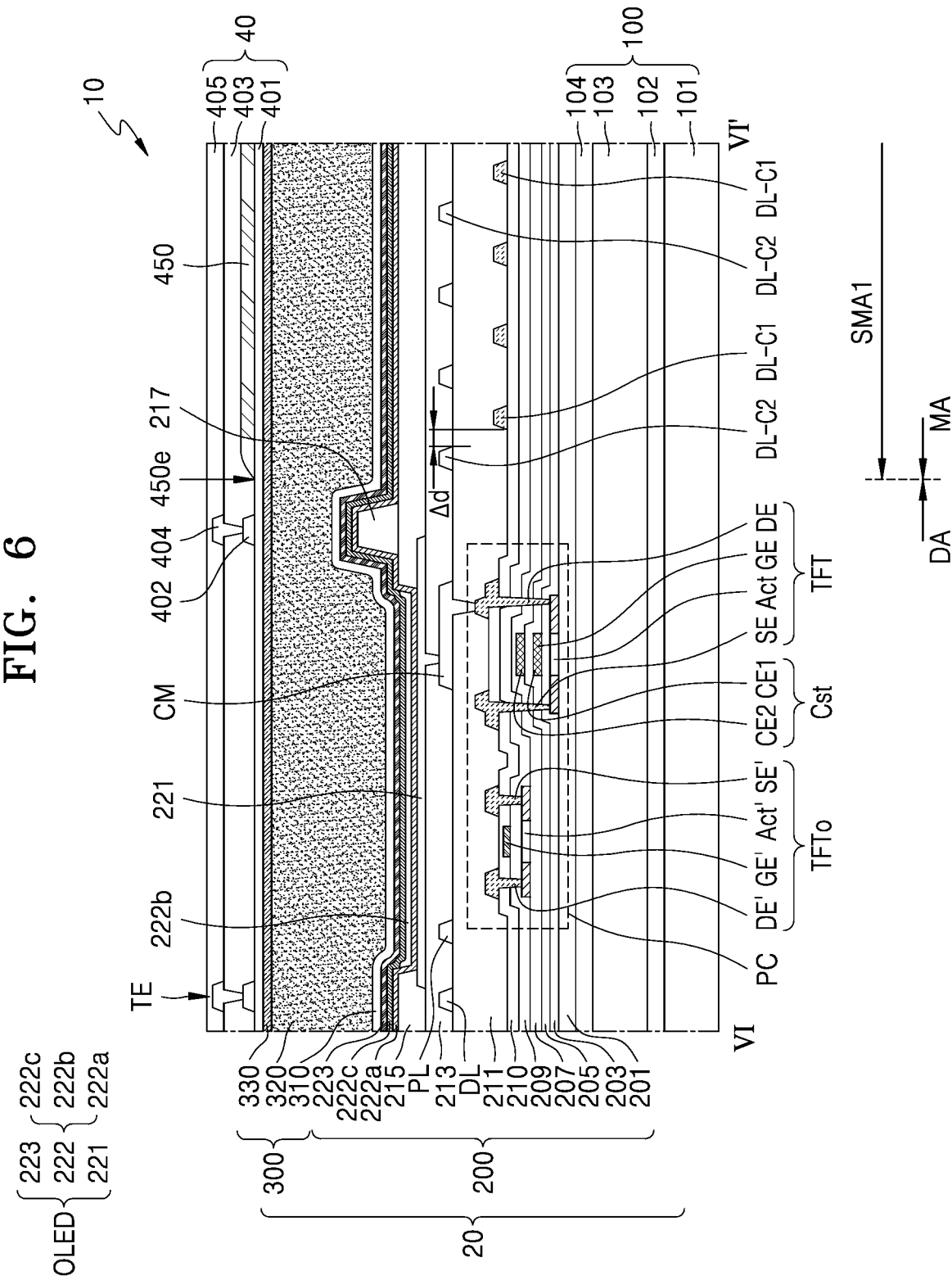
FIG. 6 is a cross-sectional view showing a region of a display panel according to an embodiment.

FIG. 6 is a cross-sectional view showing a region of the display panel 10 according to an embodiment. FIG. 6 is a cross-sectional view of the display panel 10 taken along line VI-VI' of FIG. 5.

The display panel 10 according to the embodiment includes the substrate 100. The substrate 100 may include glass, metal, or a polymer resin. When the substrate 100 is flexible or bendable, the substrate 100 may include a polymer resin such as a polyethersulfone, polyacrylate, polyetherimide, polyethylene naphthalate, polyethylene terephthalate, polyphynylene sulfide, polyarylate, polyimide, polycarbonate, or cellulose acetate propionate. The substrate 100 may be variously modified, for example, the substrate 100 may have a multi-layered structure including two layers each having a polymer resin and a barrier layer including an inorganic material such as silicon oxide, silicon nitride, silicon oxynitride, etc. between the two layers.

In an embodiment, as shown in FIG. 6, the substrate 100 may include a first base layer 101, a first barrier layer 102, a second base layer 103, and a second barrier layer 104, which are sequentially stacked. The first and second base layers 101 and 103 may each include a polymer resin. The first and second barrier layers 102 and 104 prevent infiltration of impurities from the outside, and may each include an inorganic material such as silicon oxide, silicon nitride, or silicon oxynitride in a single-layered or multi-layered structure.

A buffer layer 201 may be on the substrate 100. The buffer layer 201 may improve flatness of the upper surface of the substrate 100, or may prevent or reduce infiltration of impurities or moisture into an active layer from the outside of the substrate 100. The buffer layer 201 may include an inorganic material such as silicon oxide, silicon nitride, and/or silicon oxynitride, and may have a single-layered or multi-layered structure.

In the display area DA, the pixel circuit PC included in each of the pixels, and a light-emitting device electrically connected to the pixel circuit PC, e.g., an organic light-emitting diode OLED may be on the substrate 100. As described above with reference to FIG. 4, the pixel circuit PC may include a plurality of thin film transistors and a storage capacitor. In this regard, FIG. 6 shows a thin film transistor including a silicon-based semiconductor layer (hereinafter, silicon-based thin film transistor TFT), a thin film transistor including an oxide-based semiconductor layer (hereinafter, oxide-based thin film transistor TFTo), and the storage capacitor Cst.

The silicon-based thin film transistor TFT may include a silicon-based semiconductor layer (hereinafter, first semiconductor layer Act), a gate electrode (hereinafter, first gate electrode GE), a source electrode (hereinafter, first source electrode SE), and a drain electrode (hereinafter, first drain electrode DE) on the buffer layer 201.

The first semiconductor layer Act may include a channel region, and a source region and a drain region at opposite sides of the channel region. The first semiconductor layer Act may include a silicon-based semiconductor material. For example, the first semiconductor layer Act may include polysilicon (poly-Si) or amorphous silicon (amorphous-Si).

A first gate insulating layer 203 may be between the first semiconductor layer Act and the first gate electrode GE. The first gate insulating layer 203 may include an inorganic insulating material such as silicon oxide, silicon nitride, and silicon oxynitride, and may have a single-layered or multi-layered structure including above-stated inorganic insulating material.

The first gate electrode GE may overlap the channel region of the first semiconductor layer Act. The first gate electrode GE may include a conductive material including molybdenum (Mo), aluminum (Al), copper (Cu), titanium (Ti), etc., and may have a single-layered or multi-layered structure including above-stated material. For example, the first gate electrode GE may include a Mo layer and an Al layer, or a triple-layered structure including Mo/Al/Mo.

The first source electrode SE and the first drain electrode DE are on an inorganic insulating layer covering the first gate electrode GE. The first source electrode SE and the first drain electrode DE may be electrically connected to a source region and a drain region of the first semiconductor layer Act via contact holes. The first source electrode SE and the first drain electrode DE may include various conductive materials including molybdenum (Mo), aluminum (Al), copper (Cu), titanium (Ti), etc., and may have various layered structures. For example, each of the first source electrode SE and the first drain electrode DE may include a Ti layer and an Al layer, or a triple-layered structure including Ti/Al/Ti.

The storage capacitor Cst may include a lower electrode CE1 and an upper electrode CE2 overlapping each other. In an embodiment, the lower electrode CE1 of the storage capacitor Cst may be integrally provided with the first gate electrode GE. That is, the first gate electrode GE may also function as the lower electrode CE1 of the storage capacitor Cst, as well as the control electrode of the first thin film transistor TFT.

A first interlayer insulating layer 205 may be disposed between the lower electrode CE1 and the upper electrode CE2 of the storage capacitor Cst. The first interlayer insulating layer 205 may include an inorganic insulating material such as silicon oxide, silicon nitride, and silicon oxynitride, and may have a single-layered or multi-layered structure including above-stated inorganic insulating material.

The upper electrode CE2 of the storage capacitor Cst may have a single-layered or multi-layered structure including a low-resistive conductive material such as molybdenum (Mo), aluminum (Al), copper (Cu), and/or titanium (Ti).

A second interlayer insulating layer 207 may be on the storage capacitor Cst. The second interlayer insulating layer 207 may include an inorganic insulating material such as silicon oxide, silicon nitride, and silicon oxynitride, and may have a single-layered or multi-layered structure including above-stated inorganic insulating material.

The oxide-based thin film transistor TFTo may include an oxide-based semiconductor layer (hereinafter, second semiconductor layer Act'), a gate electrode (hereinafter, second gate electrode GE'), a source electrode (hereinafter, second source electrode SE'), and a drain electrode (hereinafter, second drain electrode DE').

The second semiconductor layer Act' may be disposed on the second interlayer insulating layer 207. That is, the first semiconductor layer Act and the second semiconductor layer Act' may be disposed at different layers from each other. The second semiconductor layer Act' may include a channel region, and a source region and a drain region at opposite sides of the channel region. The second semiconductor layer Act' may include an oxide semiconductor material. For example, the second semiconductor layer Act' may include Zn oxide-based material, e.g., Zn oxide, In—Zn oxide, Ga—In—Zn oxide, etc. Alternatively, the second semiconductor layer Act' may include In—Ga—Zn—O (IGZO), In—Sn—Zn—O (ITZO), or In—Ga—Sn—Zn—O (IG-TZO) semiconductor including ZnO with metal such as indium (In), gallium (Ga), and tin (Zn).

The second gate insulating layer 209 may be disposed between the second semiconductor layer Act' and the second gate electrode GE'. The second gate insulating layer 209 may include an inorganic insulating material such as silicon oxide, silicon nitride, and silicon oxynitride, and may have a single-layered or multi-layered structure including above-stated inorganic insulating material.

The second gate electrode GE' may overlap the channel region of the second semiconductor layer Act'. The second gate electrode GE' may include a conductive material including molybdenum (Mo), aluminum (Al), copper (Cu), titanium (Ti), etc., and may have a single-layered or multi-layered structure including above-stated material. For example, the second gate electrode GE' may include a Mo layer and an Al layer, or a triple-layered structure including Mo/Al/Mo.

The second source electrode SE' and the second drain electrode DE' are on a third interlayer insulating layer 210 covering the second gate electrode GE'. The second source electrode SE' and the second drain electrode DE' may be electrically connected to a source region and a drain region of the second semiconductor layer Act' via contact holes. The third interlayer insulating layer 210 may include an inorganic insulating material such as silicon oxynitride, and may have a single-layered or multi-layered structure including the inorganic insulating material. Also, the second source electrode SE' and the second drain electrode DE' may include various conductive materials including molybdenum (Mo), aluminum (Al), copper (Cu), titanium (Ti), etc., and may have various layered structures. For example, the second source electrode SE' and the second drain electrode DE' may each include a Ti layer and an Al layer, or a triple-layered structure including Ti/Al/Ti.

Because the thin film transistor including the semiconductor layer including the silicon-based semiconductor material, like the silicon-based thin film transistor TFT has high reliability, the silicon-based thin film transistor TFT may be adopted as the driving thin film transistor to implement a high-quality display panel.

Because the thin film transistor including the semiconductor layer having the oxide semiconductor material, like the oxide-based thin film transistor TFTo, has high carrier mobility and low leakage current, voltage drop does not increase even when the driving time increases. That is, because there is a small color change in the image due to the voltage drop even in a low frequency driving, a low frequency driving of the oxide semiconductor is possible. As described above, because the oxide semiconductor has the low leakage current, the oxide semiconductor may be employed as at least one of the other thin film transistors than the driving thin film transistor so as to prevent the leakage current and reduce power consumption.

A first organic insulating layer 211 may be disposed on the third interlayer insulating layer 210. The first organic insulating layer 211 may include an organic insulating material. The organic insulating material may include acryl, benzocyclobutene (BCB), hexamethyldisiloxane (HMDSO), or polyimide.

The data line DL, the driving voltage line PL, and the contact metal layer CM may be disposed on the first organic insulating layer 211, and may be covered by a second organic insulating layer 213. The data line DL, the driving voltage line PL, and the contact metal layer CM may each include aluminum (Al), copper (Cu), and/or titanium (Ti), and may have a single-layered or multi-layered structure including the above-stated materials. For example, each of the data line DL, the driving voltage line PL, and the contact metal layer CM may have a triple-layered structure including Ti/Al/Ti. In addition, the second organic insulating layer 213 may include an organic insulating material such as acryl, BCB, polyimide, and/or HMDSO.

The light-emitting device, e.g., the organic light-emitting diode OLED, may be disposed on the second organic insulating layer 213.

The pixel electrode 221 of the organic light-emitting diode OLED may include a reflective layer including argentum (Ag), magnesium (Mg), aluminum (Al), platinum (Pt), palladium (Pd), aurum (Au), nickel (Ni), neodymium (Nd), iridium (Ir), chrome (Cr), or a compound thereof. In another embodiment, the pixel electrode 221 may further include a conductive oxide layer on and/or under the reflective layer. The conductive oxide layer may include indium tin oxide (ITO), indium zinc oxide (IZO), zinc oxide (ZnO), indium oxide ($In_2O_3$), indium gallium oxide, and/or aluminum zinc oxide (AZO). In an embodiment, the pixel electrode 221 may have a triple-layered structure including ITO layer/Ag layer/ITO layer.

A pixel defining layer 215 may be disposed on the pixel electrode 221. An opening overlapping the pixel electrode 221 is defined in the pixel defining layer, but the opening covers edges of the pixel electrode 221. The pixel defining layer 215 may include an organic insulating material.

An intermediate layer 222 includes an emission layer 222b. The intermediate layer 222 may include a first functional layer 222a under the emission layer 222b and/or a second functional layer 222c on the emission layer 222b. The emission layer 222b may include a polymer or low-molecular weight organic material emitting predetermined color light. The second functional layer 222c may include an electron transport layer (ETL) and/or an electron injection layer (EIL). The first functional layer 222a and the second functional layer 222c may each include an organic material.

The opposite electrode 223 may include a conductive material having a low work function. For example, the opposite electrode 223 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 223 may further include a layer including ITO, IZO, ZnO, or $In_2O_3$ on the (semi-)transparent layer including the above material.

The emission layer 222b may be disposed on the display area DA so as to overlap the pixel electrode 221 via the opening in the pixel defining layer 215. On the other hand, the first functional layer 222a, the second functional layer 222c, and the opposite electrode 223 may extend to the middle area MA, beyond the display area DA.

A spacer 217 may be disposed on the pixel defining layer 215. The spacer 217 may be formed simultaneously with the pixel defining layer 215 through the same process, or may be separately formed from the pixel defining layer 215 through a separate process. In an embodiment, the spacer 217 may include an organic insulating material such as polyimide.

The organic light-emitting diode OLED may be covered by an encapsulation layer 300. The encapsulation layer 300 may include at least one organic encapsulation layer and at least one inorganic encapsulation layer. In an embodiment, FIG. 6 shows that the encapsulation layer 300 includes first and second inorganic encapsulation layers 310 and 330 and an organic encapsulation layer 320 disposed between the first and second inorganic encapsulation layers 310 and 330.

The first and second inorganic encapsulation layers 310 and 330 may include one or more inorganic materials from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each have a single-layered structure or a multi-layered structure including the above-mentioned materials. The organic encapsulation layer 320 may include a polymer-based material. The polymer-based material may include an acryl-based resin, an epoxy-based resin, polyimide, polyethylene, etc. In an embodiment, the organic encapsulation layer 320 may include acrylate.

The first inorganic encapsulation layer 310 and the second inorganic encapsulation layer 330 may have different thicknesses. The thickness of the first inorganic encapsulation layer 310 may be greater than that of the second inorganic encapsulation layer 330. Alternatively, the thickness of the second inorganic encapsulation layer 330 may be greater than that of the first inorganic encapsulation layer 310, or the first inorganic encapsulation layer 310 and the second inorganic encapsulation layer 330 may have the same thickness.

The display panel 10 may include the substrate 100, the display element layer 20 including a circuit-diode layer 200 disposed on the substrate 100, the circuit-diode layer 200 including pixel circuits and light-emitting devices, and the encapsulation layer 300, and an input sensing layer 40 disposed on the display element layer 20.

The input sensing layer 40 may include a first touch insulating layer 401 disposed on the second inorganic encapsulation layer 330, a first conductive layer 402 disposed on the first touch insulating layer 401, a second touch insulating layer 403 disposed on the first conductive layer 402, a second conductive layer 404 disposed on the second touch insulating layer 403, and a third touch insulating layer 405 disposed on the second conductive layer 404.

Each of the first touch insulating layer 401, the second touch insulating layer 403, and the third touch insulating layer 405 may include an inorganic insulating material and/or an organic insulating material. In an embodiment, the first touch insulating layer 401 and the second touch insulating layer 403 may each include an inorganic insulating material such as silicon oxide, silicon nitride, and/or silicon oxynitride, and the third touch insulating layer 405 may include an organic insulating material.

A touch electrode TE of the input sensing layer 40 may have a structure to which the first conductive layer 402 and the second conductive layer 404 are connected. Alternatively, the touch electrode TE may be at one of the first conductive layer 402 and the second conductive layer 404, and may include a metal line included in the corresponding conductive layer. The first conductive layer 402 and the second conductive layer 404 may each include aluminum (Al), copper (Cu), and/or titanium (Ti), and may have a single-layered or multi-layered structure including the above-stated materials. For example, the first conductive layer 402 and the second conductive layer 404 may each have a triple-layered structure including Ti layer/Al layer/Ti layer.

Referring to the middle area MA of FIG. 6, the middle area MA may include a first sub-middle area SMA1 through which the detour portions DL-C1 and DL-C2 of the data lines DL described above with reference to FIG. 5 pass.

The detour portions DL-C1 and DL-C2 of the data lines DL may be at different layers from each other. One of the detour portions DL-C1 and DL-C2 of the adjacent data lines DL may be on the third interlayer insulating layer 210 and the other may be on the first organic insulating layer 211.

When the detour portions DL-C1 and DL-C2 of the data lines DL are alternately arranged with the insulating layers (e.g. first planarized insulating layer 211) therebetween, a pitch (Δd) between the detour portions DL-C1 and DL-C2 of the data lines DL may be reduced, and accordingly, an area of the middle area MA may be efficiently used.

Figure 7:
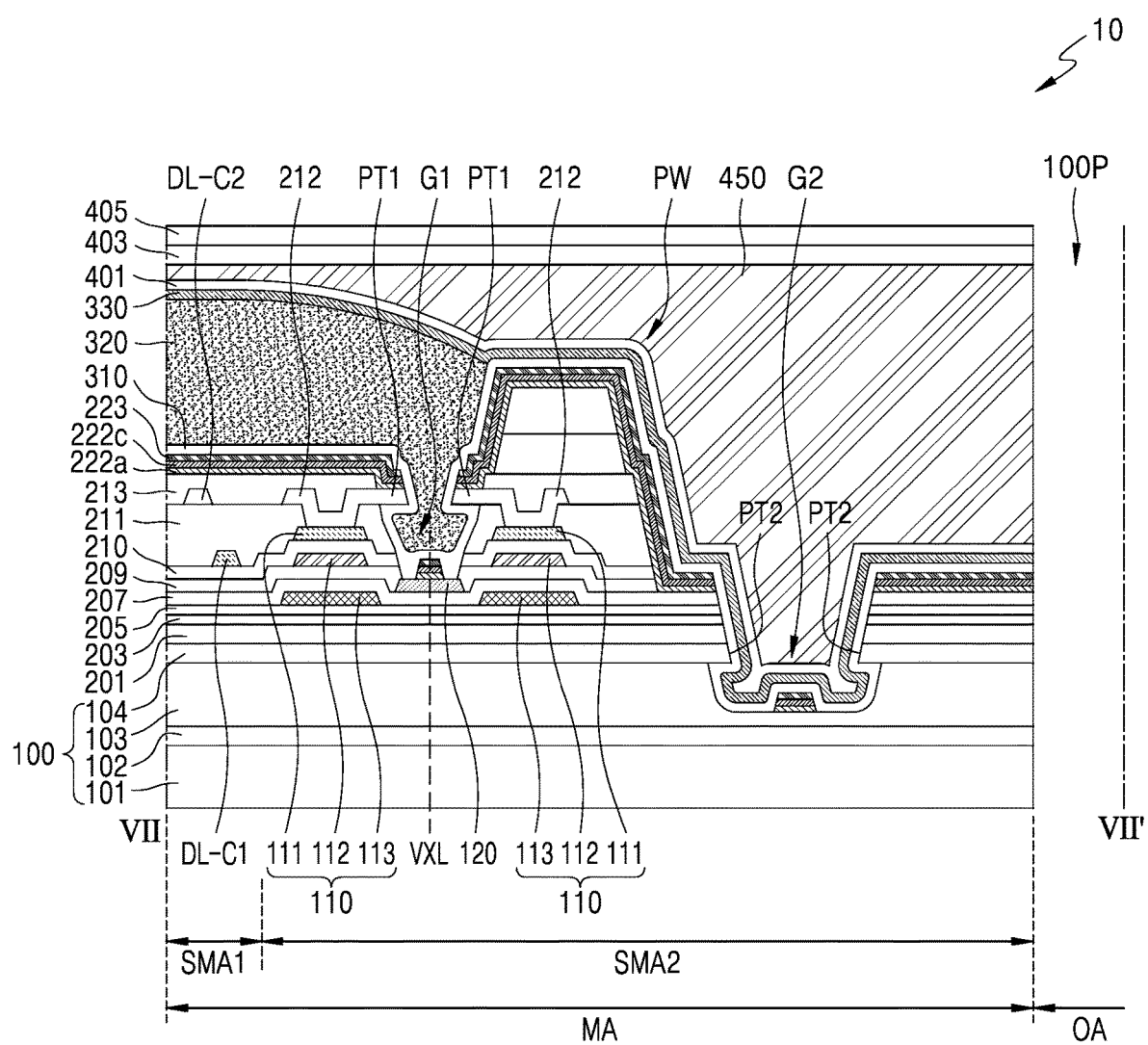
FIG. 7 is a cross-sectional view showing a region of a display panel according to an embodiment.

FIG. 7 is a cross-sectional view showing a region of the display panel 10 according to an embodiment. FIG. 7 is a cross-sectional view of the display panel 10 taken along line VII-VII' of FIG. 5.

Referring to FIGS. 6 and 7, the middle area MA may include the first sub-middle area SMA1 adjacent to the display area DA (see FIG. 6) and a second sub-middle area SMA2 adjacent to the opening area OA. The detour portions DL-C1 and DL-C2 of the data lines DL described above with reference to FIG. 6 are in the first sub-middle area SMA1, and the first and second grooves G1 and G2 and a barrier wall PW may be in the second sub-middle area SMA2. In addition, the encapsulation layer 300 extends to the middle area MA to cover the first groove G1, the second groove G2, and/or the barrier wall PW.

Referring to FIG. 7, the first groove G1 is in the second sub-middle area SMA2 that is adjacent to the first sub-middle area SMA1, and the second groove G2 is in the second sub-middle area SMA2 that is adjacent to the opening area OA. As described above, the number and arranging relations of the first groove G1 and the second groove G2 may be variously modified.

The first and second grooves G1 and G2 may be on a multi-layered film including at least two layers having different materials. The multi-layered film on which the first and second grooves G1 and G2 may correspond to some of the components included in the display panel 10. In an embodiment, the first groove G1 may be on the inorganic insulating layer that is on the substrate 100, and the second groove G2 may be on the multi-layered film included in the substrate 100.

The first groove G1 may penetrate through at least one insulating layer on the substrate 100. The at least one insulating layer in which the first groove G1 is formed includes the first organic insulating layer 211, and may further include insulating layer(s) under the first organic insulating layer 211. Regarding this, FIG. 7 shows that the first groove G1 is on the second interlayer insulating layer 207 and penetrates through the second gate insulating layer 209, the third interlayer insulating layer 210, and the first organic insulating layer 211. In this case, the second gate insulating layer 209, the third interlayer insulating layer 210, and the first organic insulating layer 211 may respectively include holes overlapping one another, and the holes are spatially connected to one another to form the first groove G1.

The first groove G1 may be obtained through an etching process, in which the second gate insulating layer 209, the third interlayer insulating layer 210, and the first organic insulating layer 211 are partially removed.

In an embodiment, a lower layer 120 may be immediately under the first groove G1. The lower layer 120 may act as an etch stopper in the etching process for forming the first groove G1. Therefore, a bottom surface of the first groove G1 may be an upper surface of the lower layer 120. Unlike in FIG. 7, when there are a plurality of first grooves G1, the lower layer 120 may be under each of the first grooves G1.

The lower layer 120 is on the second interlayer insulating layer 207, and may be formed simultaneously with the second semiconductor layer Act' (see FIG. 6) described above with reference to FIG. 6 through the same process. In an embodiment, the lower layer 120 may include the same material as that of the second semiconductor layer Act', e.g., oxide semiconductor material. In addition, the lower layer 120 may have a closed loop shape surrounding the opening area OA in a plan view, like the first groove G1.

In an embodiment, a metal dummy stack 110 may be adjacent to the first groove G1. For example, the metal dummy stacks 110 may be respectively at opposite sides of the first groove G1. The metal dummy stack 110 is a kind of mound which may increase a depth of the first groove G1 and may function as a crack detector. In an embodiment, FIG. 7 shows that the metal dummy stack 110 includes three metal layers overlapping with insulating layers therebetween, e.g., first, second, and third metal layers 111, 112, and 113.

The first, second, and third metal layers 111, 112, and 113 may be disposed at the same layers as those of the transistors and the electrodes of the storage capacitor described above with reference to FIG. 6, and may include the same material. For example, the first metal layer 111 may be disposed at the same layer as the first source electrode SE, the first drain electrode DE, the second source electrode SE', or the second drain electrode DE', and may include the same material as that of the first source electrode SE, the first drain electrode DE, the second source electrode SE', or the second drain electrode DE'. The second metal layer 112 may be at the same layer and may include the same material as that of the second gate electrode GE'. The third metal layer 113 may be disposed at the same layer and may include the same material as that of the upper electrode CE2 of the storage capacitor Cst. FIG. 7 shows that the metal dummy stack 110 includes three metal layers overlapping one another with insulating layers therebetween, but one or more embodiments are not limited thereto. In another embodiment, the number of the metal layers in the metal dummy stack 100 may be less than or may exceed three.

The first groove G1 is not disposed on the substrate 100, but on the inorganic insulating layer that is disposed on the substrate 100. Thus, the moisture that may be flowed in through the substrate 100 may be blocked by at least one inorganic insulating layer. In this regard, FIG. 7 shows the structure, in which the first groove G1 is disposed on the buffer layer 201, the first gate insulating layer 203, and the first interlayer insulating layer 205, and the buffer layer 201, the first gate insulating layer 203, and the first interlayer insulating layer 205 may effectively block the moisture that may be flowed in through the substrate 100.

The first groove G1 may include at least one first tip PT1. In an embodiment, as shown in FIG. 7, the first groove G1 may have first tips PT1 that are at opposite sides of a virtual vertical line VXL that passes through a center of the first groove G1. In another embodiment, the first groove G1 may include only one first tip PT1 located at a side.

The first tip PT1 may be provided in the metal pattern layer 212 that is immediately on the first organic insulating layer 211. The metal pattern layer 212 may be disposed at the same layer and may include the same material as that of the data line DL (see FIG. 6), the driving voltage line PL (see FIG. 6), and/or the contact metal layer CM (see FIG. 6). In an embodiment, the metal pattern layer 212 may have a triple-layered structure including Ti layer/Al layer/Ti layer.

The metal pattern layer 212 may be on at least one side of the first groove G1. For example, the metal pattern layers 212 may be disposed at opposite sides of the virtual vertical line VXL that passes through the center of the first groove G1, and an end of each of the metal pattern layer 212 protrudes toward the center of the first groove G1 to form the first tip PT1. The first tip PT1 is a kind of eaves portion which may protrude toward the center of the first groove G1 beyond the inner surface of the first organic insulating layer 211, which configures the inner surface of the first groove G1. When the first tips PT1 are at opposite sides of the first groove G1, the first groove G1 may include holes respectively in the metal pattern layer 212, the second gate insulating layer 209, the third interlayer insulating layer 210, and the first organic insulating layer 211. In addition, the holes may overlap one another and may be connected to one another.

The first groove G1 may be formed before the process of forming the intermediate layer 222, and the intermediate layer 222 and the opposite electrode 223 may be obtained by a thermal deposition method. At least one organic material layer included in the intermediate layer and/or the opposite electrode 223 are disconnected by the first tips PT1 of the first groove G1, and thus, the proceeding of the moisture toward the display area DA (see FIG. 5) may be prevented. In this regard, FIG. 7 shows that the first functional layer 222a, the second functional layer 222c, and the opposite electrode 223 are disconnected by the first tip PT1 of the first groove G1, but one or more embodiments are not limited thereto. For example, one of the first functional layer 222a and the second functional layer 222c may be omitted.

The inorganic encapsulation layer included in the encapsulation layer 300 may have a relatively superior step coverage to those of the first functional layer 222a, the second functional layer 222c, and/or the opposite electrode 223, and may not be disconnected by the first groove G1. In an embodiment, as shown in FIG. 7, the first inorganic encapsulation layer 310 may not be disconnected by the first groove G1, but may be continuously provided. In detail, the first inorganic encapsulation layer 310 may continuously cover inner and lower surfaces of the metal pattern layer 212, the inner surface of the first organic insulating layer 211, the inner surface of the third interlayer insulating layer 210, and the inner surface of the second gate insulating layer 209, along with the shape of the first groove G1.

The second groove G1 may be disposed on a multi-layered film included in the substrate 100. In this regard, FIG. 7 shows that the second groove G2 is in the multi-layered film including the second base layer 103 and the second barrier layer 104, but one or more embodiments are not limited thereto.

In an embodiment, as shown in FIG. 7, the second groove G2 may have a recess that is concave in a thickness direction of the second base layer 103 and a hole penetrating through the second barrier layer 104. Here, 'recess' denotes a groove partially formed in the second base layer 103 in the thickness direction. That is, in a portion where the recess is formed, a remaining part of the second base layer 103 in the thickness direction may cover a layer under the second base layer 103 (e.g., first barrier layer 102). The recess that is concave in the thickness direction of the second base layer 103 may be obtained by forming a hole penetrating through the second barrier layer 104 by etching the second barrier layer 104 and then partially etching the second base layer 103. The recess in the second base layer 103 and the hole in the second barrier layer 104 may be spatially connected to each other to form the second groove G2. The etching may be performed by an isotropic etching method and/or an anisotropic etching method.

In another embodiment, unlike the example shown in FIG. 7, the second groove G2 may include a hole penetrating through the second base layer 103 and a hole penetrating through the second barrier layer 104. The hole penetrating through the second barrier layer 104 may be obtained by etching the second barrier layer, and the hole penetrating through the second base layer 103 may be obtained by etching the second base layer 103. The hole in the second base layer 103 and the hole in the second barrier layer 104 may be spatially connected to each other to form the second groove G2.

A cross-section of the second groove G2 may have an undercut shape that is concave in the thickness direction of the multi-layered film. An inner surface of the hole penetrating through the second barrier layer 104 may protrude more than the inner surface of the recess concave in the thickness direction of the second base layer 103 or the inner surface of the hole penetrating through the second base layer 103, in the direction (e.g., x-direction) parallel to the upper surface (or lower surface) of the substrate 100. The protruding portions of the second barrier layer 104 toward the center of the second groove G2 may form second tips PT2.

The second groove G2 may be formed before the process of forming the intermediate layer 222, and the intermediate layer 222 and the opposite electrode 223 may be obtained by a thermal deposition method. At least one organic material layer included in the intermediate layer and/or the opposite electrode 223 are disconnected by the second tips PT2 of the second groove G2, and thus, the proceeding of the moisture toward the display area DA (see FIG. 5) may be prevented. In this regard, FIG. 7 shows that the first functional layer 222a, the second functional layer 222c, and the opposite electrode 223 are disconnected by the second tip PT2 of the second groove G2, but one or more embodiments are not limited thereto. For example, one of the first functional layer 222a and the second functional layer 222c may be omitted.

The inorganic encapsulation layer included in the encapsulation layer 300 may have a relatively superior step coverage to those of the first functional layer 222a, the second functional layer 222c, and/or the opposite electrode 223, and may not be disconnected by the second groove G2. In an embodiment, as shown in FIG. 7, the first inorganic encapsulation layer 310 may not be disconnected by the second groove G2, but may be continuously provided. In detail, the first inorganic encapsulation layer 310 may continuously cover inner and lower surfaces of the metal pattern layer 212, the inner surface of the first organic insulating layer 211, the inner surface of the third interlayer insulating layer 210, and the inner surface of the second gate insulating layer 209, along with the shape of the first groove G1.

Figure 8:
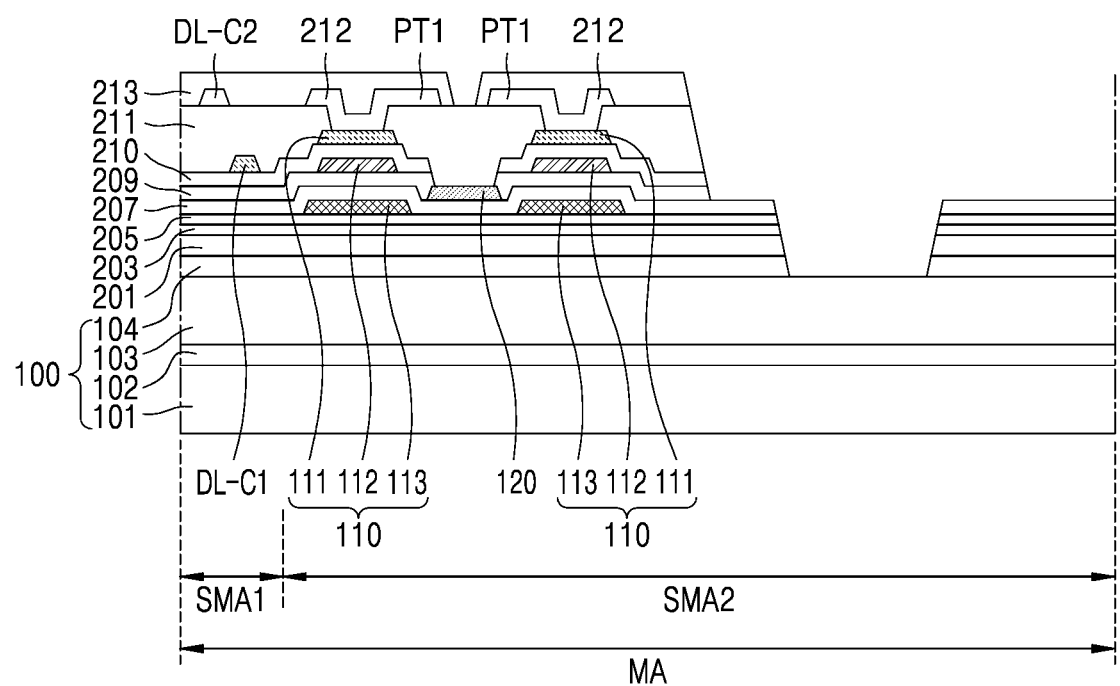
FIGS. 8, 9, and 10 are cross-sectional views sequentially showing some of processes of manufacturing the display panel of FIG. 7.
Figure 9:
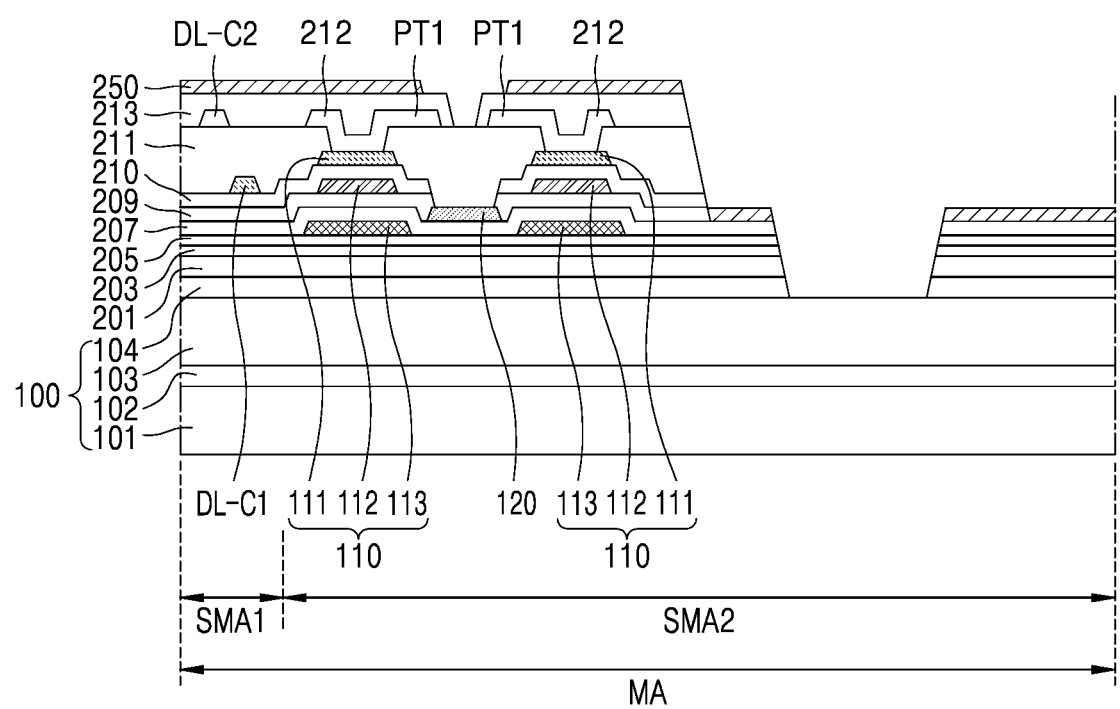
Figure 10:
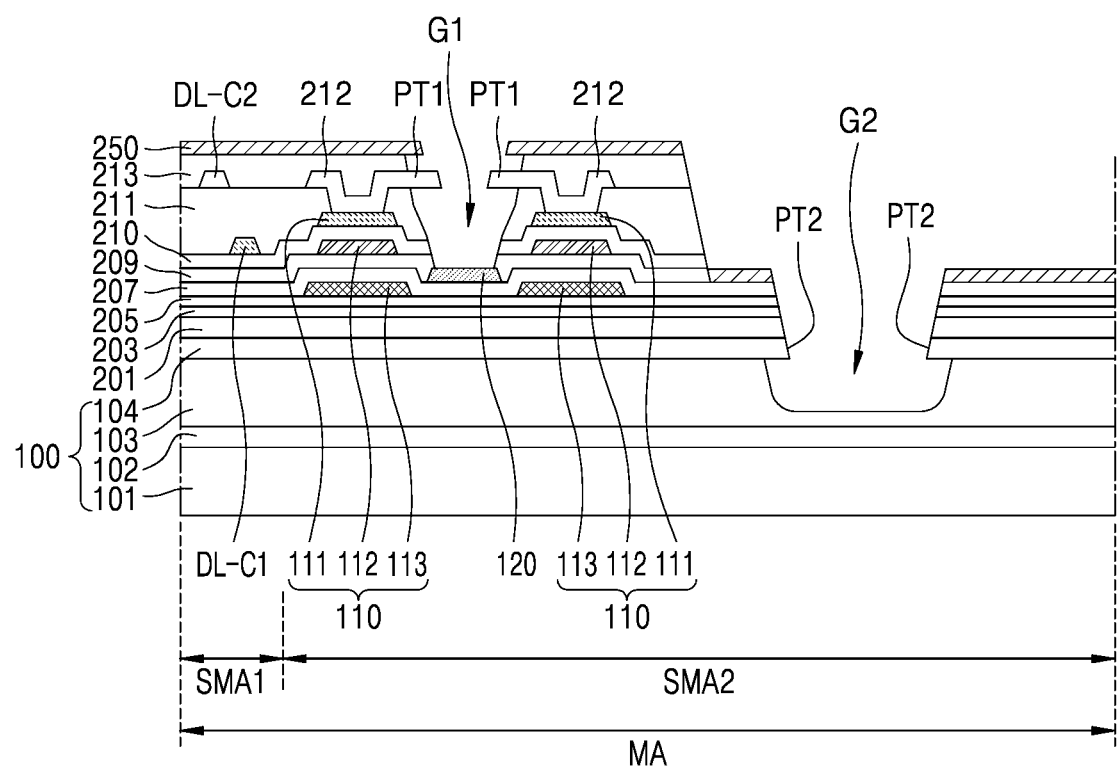

FIGS. 8, 9, and 10 are cross-sectional views sequentially showing some of processes of manufacturing the display panel 10 of FIG. 7. FIGS. 8, 9, and 10 only illustrate a part of the middle area MA, and in the display area DA (see FIG. 6), the components at the same layer may be formed together.

As shown in FIG. 8, a plurality of insulating layers and the metal dummy stack 110, the lower layer 120, and the metal pattern layer 212 are formed on the substrate 100, and the second organic insulating layer 213 covering the metal pattern layer 212 is formed. The second organic insulating layer 213 has an opening that overlaps a portion where the first groove G1 is to be formed, and each of the second barrier layer 104, the buffer layer 201, the inorganic insulating layers 203, 205, and 207 on the buffer layer 201 has an opening overlapping a portion where the second groove G2 is to be formed.

In addition, the second organic insulating layer 213 covers edges of the metal pattern layer 212. Accordingly, the first tip PT1 of the metal pattern layer 212 is not exposed in post-processes and may be protected by the second organic insulating layer 213.

Next, as shown in FIG. 9, a mask layer 250 is formed on the second organic insulating layer 213. The mask layer 250 is a layer arranged during manufacturing processes to perform as a mask and then is removed. The mask layer 250 may have a pattern corresponding to portions where the first tip PT1 of the first groove G1 and the second tip PT2 of the second groove G2 are to be formed. In an embodiment, the mask layer 250 may include indium zinc oxide (IZO).

In addition, as shown in FIG. 10, an etching process is performed in a state in which the mask layer 250 is arranged, to form the first groove G1 and the second groove G2. That is, the first groove G1 and the second groove G2 may be simultaneously formed through the same process. In an embodiment, the etching may be performed by a wet etching method and/or an isotropic etching method, but is not limited thereto. In another embodiment, the etching may be performed by a dry etching method and/or an anisotropic etching method.

During the etching process, the insulating layers under the mask layer 250 are at least partially etched to form the grooves. In detail, a portion overlapping the mask layer 250 is not etched, and a portion not overlapping the mask layer 250 may be etched to form the groove. In this regard, FIG. 10 shows that each of the second gate insulating layer 209, the third interlayer insulating layer 210, and the first organic insulating layer 211 is partially etched to form the first groove G1 and each of the buffer layer 201, the first gate insulating layer 203, the first interlayer insulating layer 205, and the second interlayer insulating layer 207 is partially etched to form the second groove G2.

Through the above etching process, the first groove G1 and the second groove G2 may each have an undercut shape that is concave in the thickness direction. Also, the first groove G1 includes the first tip PT1 that is a protrusion from the metal pattern layer 212 toward the center of the first groove G1, and the second groove G2 includes the second tip PT2 that is a protrusion from the first gate insulating layer 203 toward the center of the second groove G2.

Figure 11:
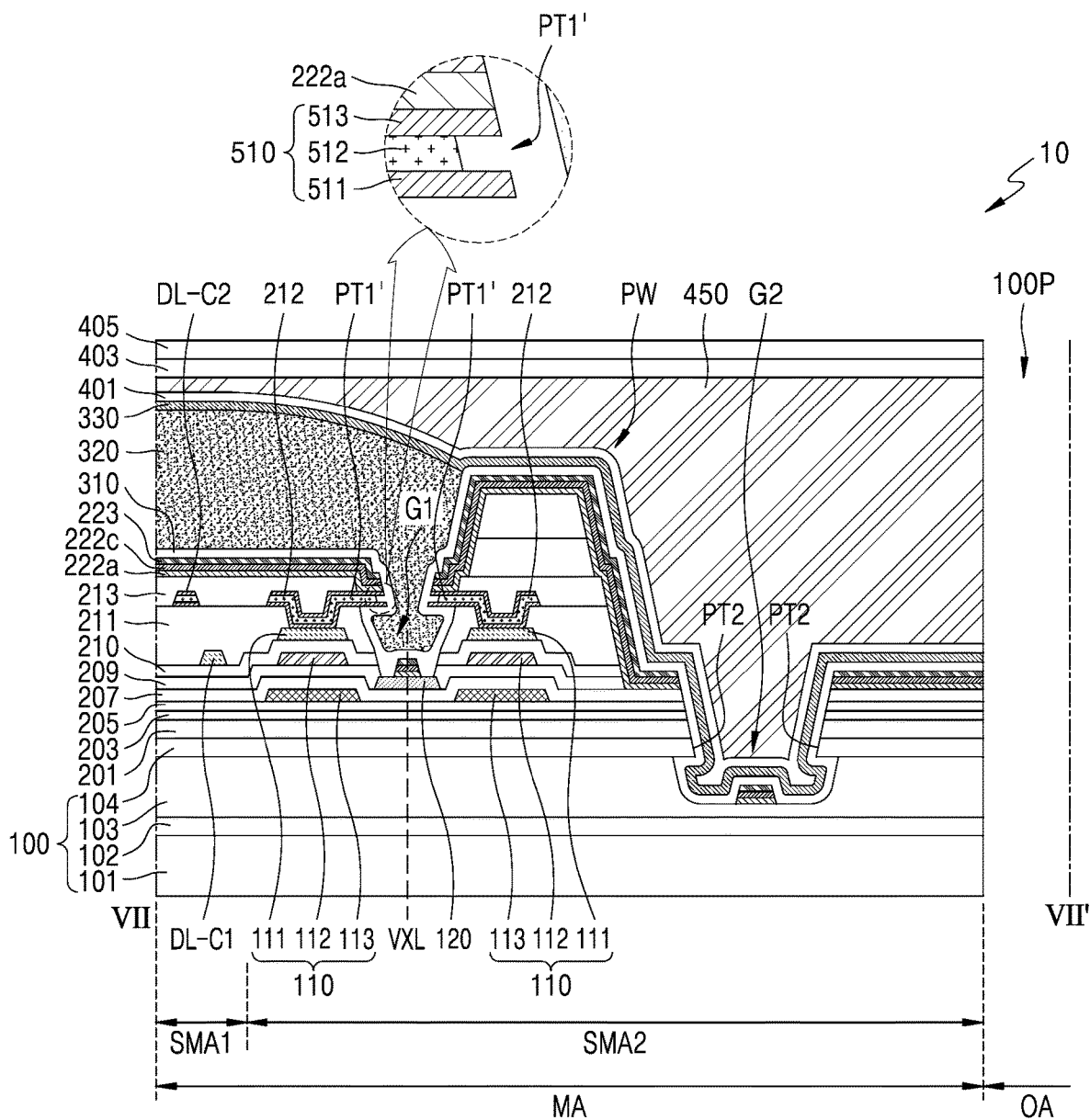
FIG. 11 is a cross-sectional view showing a region of a display panel according to an embodiment.

FIG. 11 is a cross-sectional view showing a region of the display panel 10 according to an embodiment. FIG. 11 is a cross-sectional view of the display panel 10 taken along line VII-VII' of FIG. 5. In addition, FIG. 11 is different from the example of FIG. 7 only in view of a tip structure in the first groove G1, and the difference will be described below in detail.

Referring to FIG. 11, the first groove G1 may have a first tip PT1' having a multi-layered structure 510 including a concave portion. The first tip PT1' of the first groove G1 may be in the metal pattern layer 212. The metal pattern layer 212 may include the same material as that of the data line DL, the driving voltage line PL, and/or the contact metal layer CM described above with reference to FIG. 6. In an embodiment, the metal pattern layer 212 may have the multi-layered structure 510 including a first layer 511 including titanium (Ti), a second layer 512 including aluminum (Al), and a third layer 513 including titanium (Ti) that are sequentially stacked.

The multi-layered structure 510 may have a concave portion that is obtained when the second layer 512 is depressed toward the center of the second layer 512. The first layer 511 and the third layer 513 may further protrude than the second layer 512 in the direction toward the center of the first groove G1, and then, the tip may be obtained. In this case, a width of the second layer 512 may be smaller than those of the first layer 511 and the third layer 513.

The concave portion of the multi-layered structure 510 may be obtained by an etching, e.g., an isotropic etching process, and the concave portion may be formed according to an etch ratio between the layers included in the multi-layered structure 510. For example, the second layer 512 of the multi-layered structure 510 may include a material having an etch rate greater than those of the first layer 511 and the third layer 513, and thus, the second layer 512 may be further etched relatively and depressed in a direction away from the center of the first groove G1.

From among the layers in the multi-layered structure 510, a layer including a material having relatively large etch rate may be exposed and further etched in post-processes. For example, the second layer 512 of the multi-layered structure 510 includes aluminum (Al) as a material having relatively fast etch rate, and the first layer 511 and the third layer 513 in the multi-layered structure 510 may include titanium (Ti) as a material having relatively slow etch rate. In an embodiment, in an etching process (e.g., wet-etching process) for patterning the pixel electrode 221 in post-processes, the second layer 512 including aluminum (Al) is additionally etched, but the first layer 511 and the third layer 513 including titanium (Ti) may not be additionally etched. Accordingly, the second layer 512 may have a shape that is further depressed in a direction away from the center of the first groove G1. The effect that the layers exposed in the post-processes are differentially further etched due to the difference between the etch rates of the layers may be also applied to a first stack structure 610 (see FIG. 20), a second stack structure 620 (see FIG. 20), and a third stack structure 630 (see FIG. 20).

The concave portion of the multi-layered structure 510 may be formed before the process of forming the intermediate layer 222, and the intermediate layer 222 and the opposite electrode 223 may be obtained by a thermal deposition method. The at least one organic material layer included in the intermediate layer and/or the opposite electrode 223 may be disconnected at one point of the concave portion in the multi-layered structure 510 and discontinuously formed.

In an embodiment, the multi-layered structure 510 may be at the same layer, may have the same multi-layered structure, and may include the same material as those of the data line DL, the driving voltage line PL, and/or the contact metal layer CM. For example, the data line DL, the driving voltage line PL, and/or the contact metal layer CM may each include a Ti layer, an Al layer, and a Ti layer that are sequentially stacked.

Figure 12:
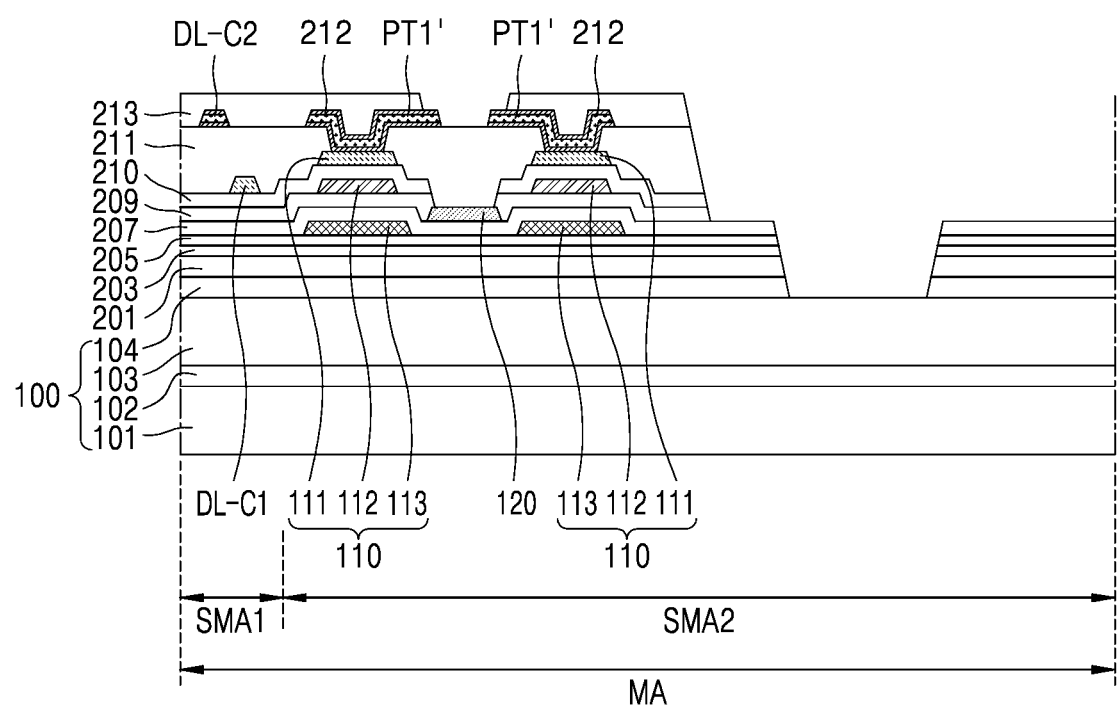
FIGS. 12, 13, and 14 are cross-sectional views sequentially showing some of processes of manufacturing the display panel of FIG. 11.
Figure 13:
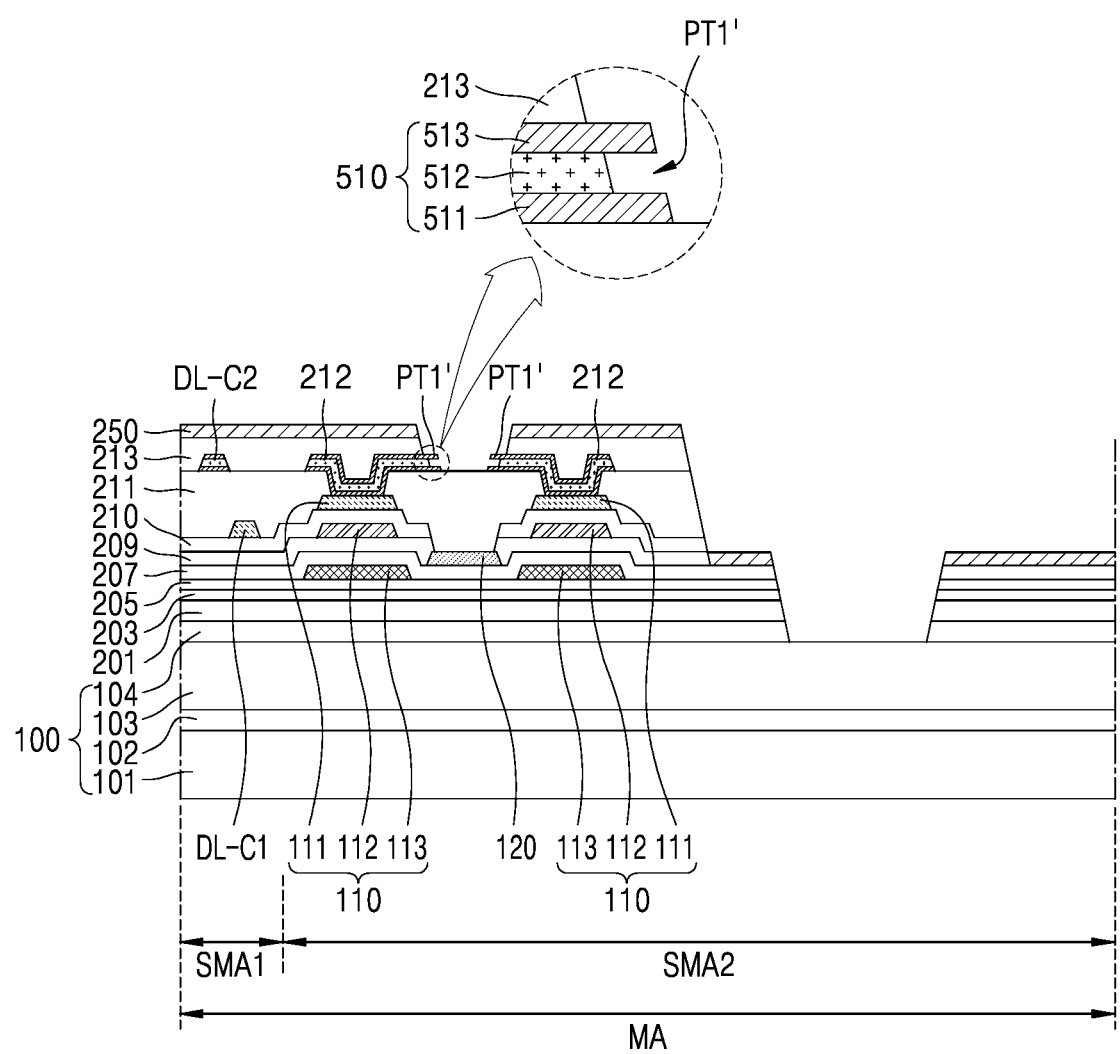
Figure 14:
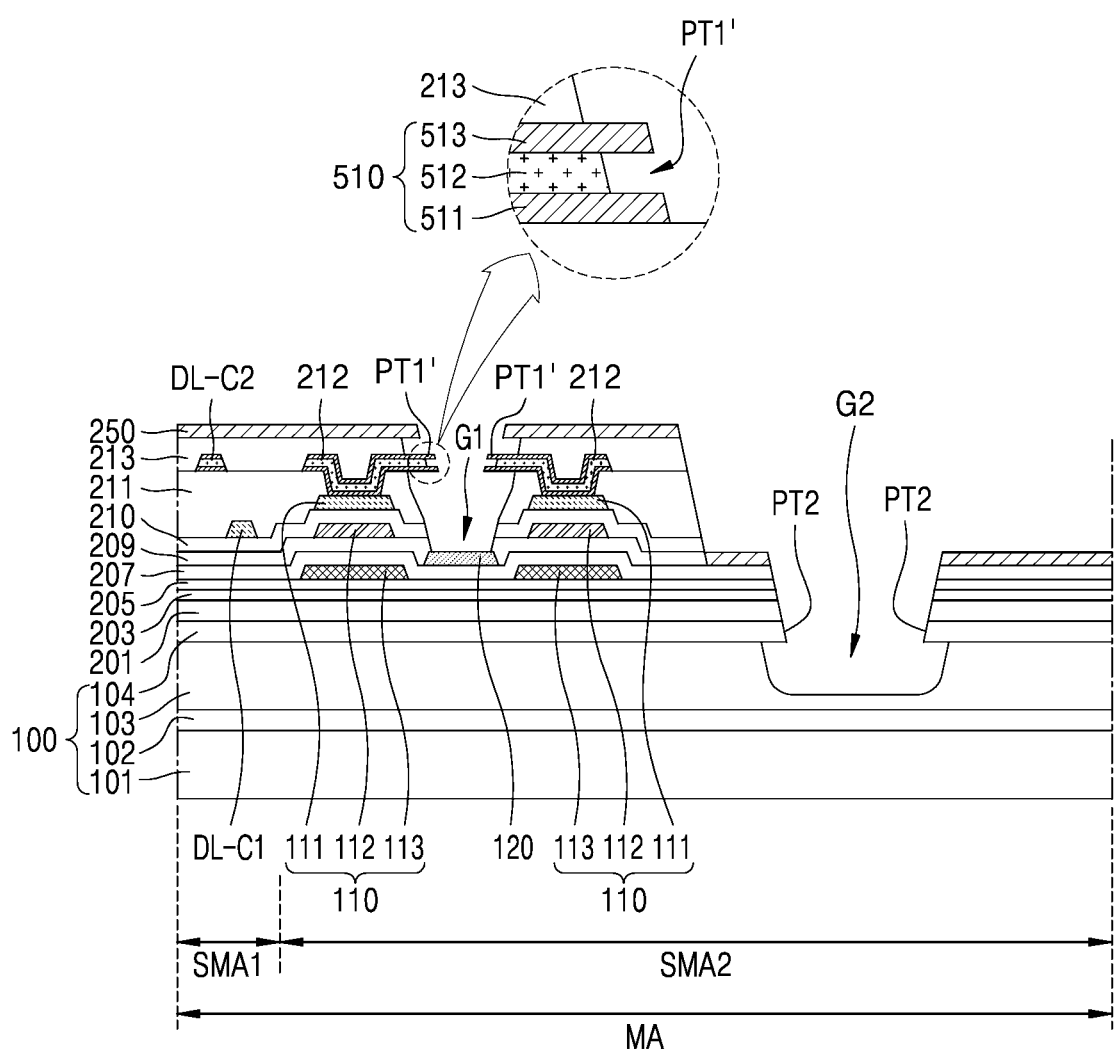

FIGS. 12, 13, and 14 are cross-sectional views sequentially showing some of processes of manufacturing the display panel of FIG. 11.

As shown in FIG. 12, a plurality of insulating layers and the metal dummy stack 110, the lower layer 120, and the metal pattern layer 212 are formed on the substrate 100, and the second organic insulating layer 213 covering the metal pattern layer 212 is formed. An opening that overlaps a portion where the first groove G1 is to be formed is defined in the second organic insulating layer 213, and an opening overlapping a portion where the second groove G2 is to be formed is defined in each of the second barrier layer 104, the buffer layer 201, the inorganic insulating layers 203, 205, and 207 disposed on the buffer layer 201. In addition, the metal pattern layer 212 has a triple-layered structure including Ti layer/Al layer/Ti layer.

In addition, the second organic insulating layer 213 does not cover edges of the metal pattern layer 212. That is, the opening of the second organic insulating layer 212 is wider than the opening in the metal pattern layer 212, and exposes the first tip PT1' of the metal pattern layer 212. Accordingly, the first tip PT1' of the metal pattern layer 212 may be exposed during post-processes.

In addition, as shown in FIG. 13, the multi-layered structure 510 having a concave portion at the end of the first tip PT1' may be formed during performing the post-processes.

As described above, from among the layers in the multi-layered structure 510, a layer including a material having relatively large etch rate may be exposed and further etched in post-processes. In this regard, in FIG. 13, the first tip PT1' of the metal pattern layer 212 is exposed in the post-processes, and thus, the second layer 512 is additionally etched and the concave portion is formed. The second layer 512 of the multi-layered structure 510 includes aluminum (Al) as a material having relatively fast etch rate, and the first layer 511 and the third layer 513 in the multi-layered structure 510 may include titanium (Ti) as a material having relatively slow etch rate. In an embodiment, in an etching process (e.g., wet-etching process) for patterning the pixel electrode 221 in post-processes, the second layer 512 including aluminum (Al) is additionally etched, but the first layer 511 and the third layer 513 including titanium (Ti) may not be additionally etched. Accordingly, the second layer 512 may have a shape that is further depressed in a direction away from the center of the first groove G1.

Next, the mask layer 250 is formed on the second organic insulating layer 213. The mask layer 250 is a layer arranged during manufacturing processes to perform as a mask and then is removed. The mask layer 250 may have a pattern corresponding to portions where the first tip PT1' of the first groove G1 and the second tip PT2 of the second groove G2 are to be formed. In an embodiment, the mask layer 250 may include indium zinc oxide (IZO).

In addition, as shown in FIG. 14, an etching process is performed in a state in which the mask layer 250 is arranged, to form the first groove G1 and the second groove G2. That is, the first groove G1 and the second groove G2 may be simultaneously formed through the same process. During the etching process, the insulating layers under the mask layer 250 are at least partially etched to form the grooves. In detail, a portion overlapping the mask layer 250 is not etched, and a portion not overlapping the mask layer 250 may be etched to form the groove. In this regard, FIG. 14 shows that each of the second gate insulating layer 209, the third interlayer insulating layer 210, and the first organic insulating layer 211 is partially etched to form the first groove G1 and each of the buffer layer 201, the first gate insulating layer 203, the first interlayer insulating layer 205, and the second interlayer insulating layer 207 is partially etched to form the second groove G2.

In an embodiment, the etching may be performed by the wet etching method and/or the isotropic etching method. Accordingly, an undercut shape that is concave in the thickness direction may be obtained. In addition, the first groove G1 includes the first tip PT1' that is a protrusion from the metal pattern layer 212 toward the center of the first groove G1, and the second groove G2 includes the second tip PT2 that is a protrusion from the first gate insulating layer 203 toward the center of the second groove G2.

Figure 15:
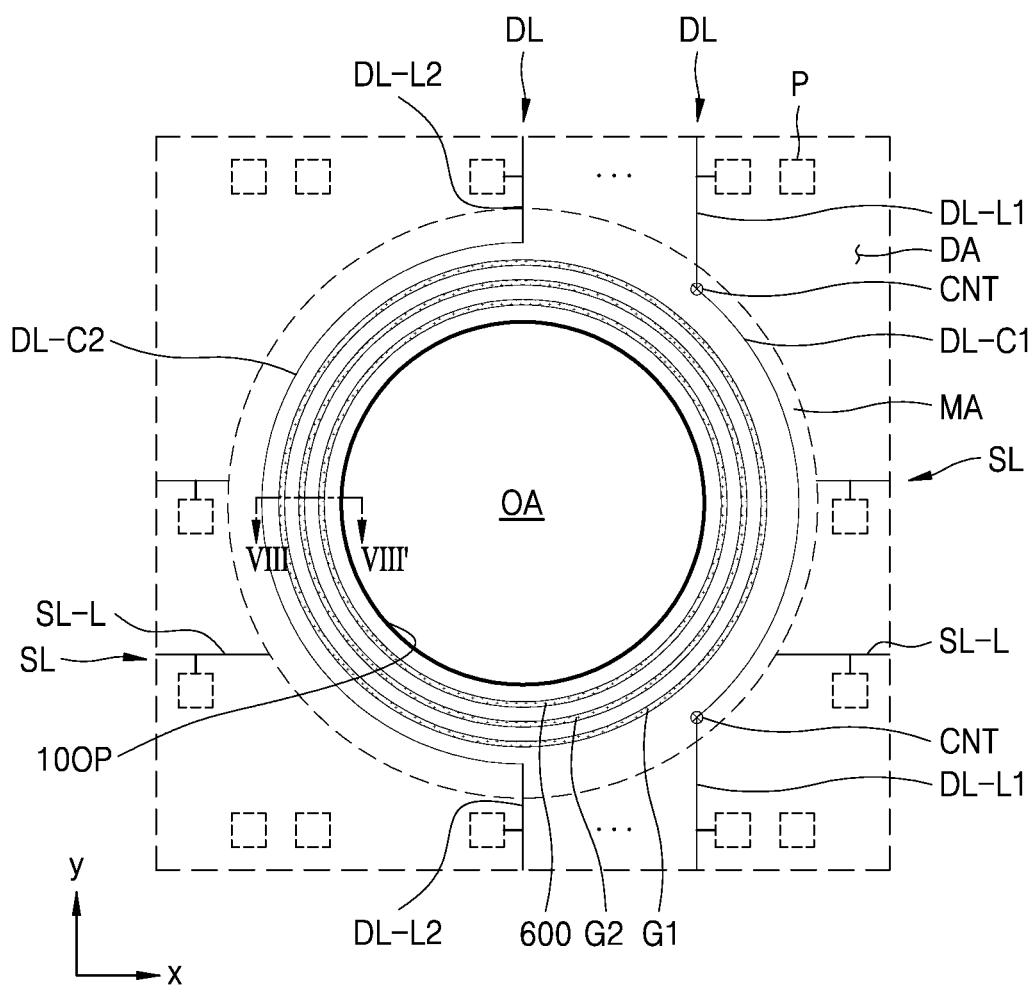
FIG. 15 is a plan view partially showing a region of a display panel according to an embodiment.
Figure 16:
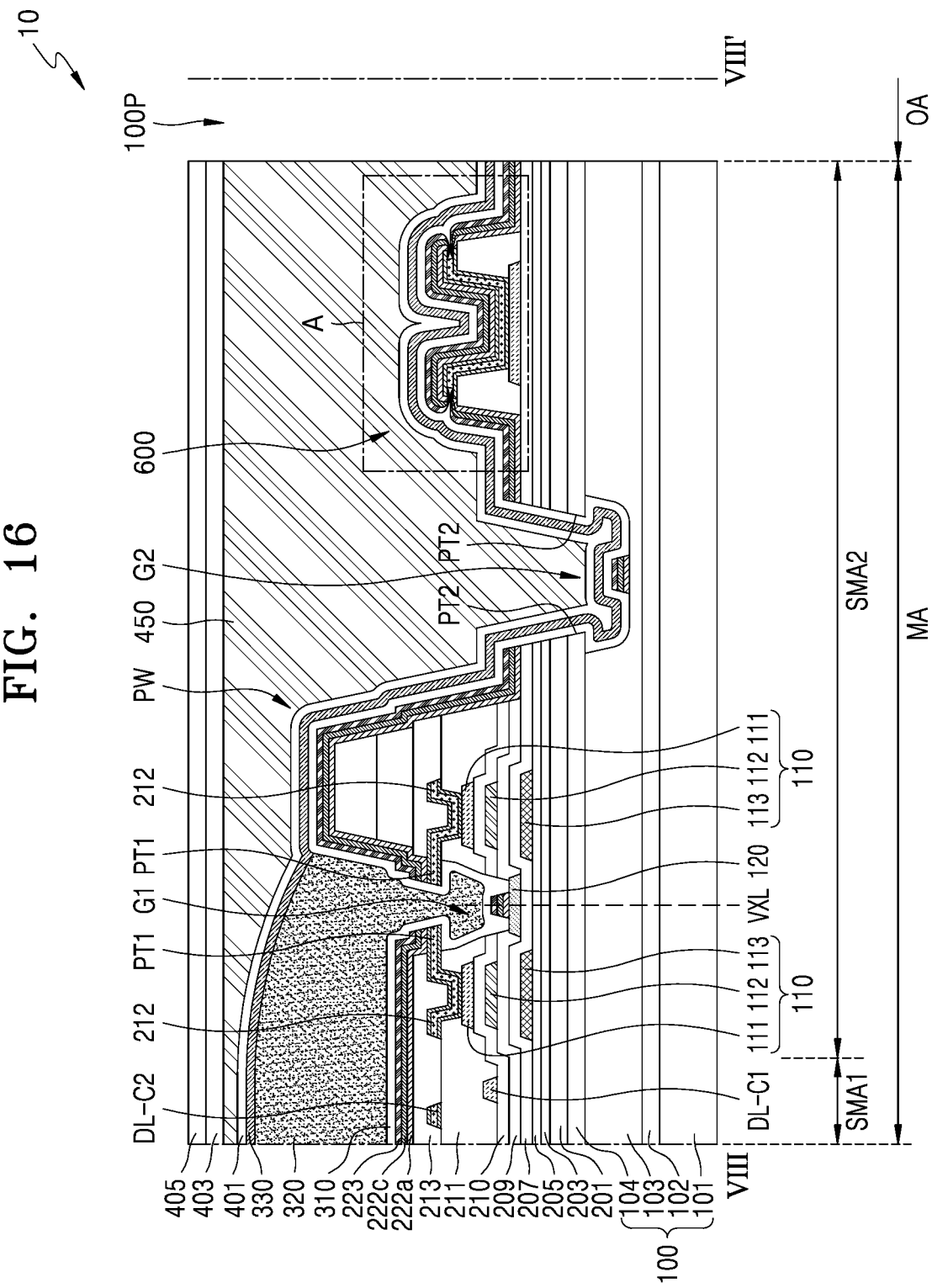
FIG. 16 is a cross-sectional view showing a region of a display panel according to an embodiment.

FIG. 15 is a plan view showing a region of the display panel 10 according to an embodiment, and FIG. 16 is a cross-sectional view showing a region of the display panel 10 according to the embodiment. FIG. 16 is a cross-sectional view of the display panel 10 taken along line VIII-VIII' of FIG. 15. Also, the embodiment as shown in FIGS. 15 and 16 is only different in view of further including a disconnection portion 600 as compared with the embodiment of FIG. 7, and thus, difference will be described below.

Referring to FIGS. 15 and 16, the display panel 10 according to the embodiment may further include the disconnection portion 600.

The disconnection portion 600 may be in the middle area MA. The disconnection portion 600 has a closed loop shape surrounding the opening area OA in a plan view, and may be spaced apart from the first and second grooves G1 and G2 described above. The number and arrangement order of the disconnection portion 600 are not restricted. In an embodiment, as shown in FIG. 15, one disconnection portion 600 surrounds the opening area OA, and the first and second grooves G1 and G2 may surround the disconnection portion 600. In another embodiment, a plurality of disconnection portions 600 may be provided. In addition, the disconnection portion 600 may be between the first groove G1 and the second groove G2, or may surround the first groove G1 and the second groove G2. In another embodiment, one of the first groove G1 and the second groove G2 may be omitted. For example, the display panel 10 may only include the first groove G1 and the disconnection portion 600, or the second groove G2 and the disconnection portion 600.

The disconnection portion 600 may be on the inorganic insulating layer that is on the substrate 100. In this regard, FIG. 16 shows that the disconnection portion 600 is on the second interlayer insulating layer 207, but one or more embodiments are not limited thereto. In another embodiment, the disconnection portion 600 may be on the substrate 100, the buffer layer 201, the first gate insulating layer 203, the first interlayer insulating layer 205, the second gate insulating layer 209, or the third interlayer insulating layer 210.

The disconnection portion 600 may include at least one stack structure in which a plurality of sub-layers are stacked. In this regard, FIG. 16 shows an example in which the disconnection portion 600 only includes the second stack structure 620. Referring to FIG. 16, an electrode pattern layer 111a may be on the second interlayer insulating layer 207. In an embodiment, the electrode pattern layer 111a may have the same layered structure and include the same material as those of the first source electrode SE (see FIG. 6), the first drain electrode DE (see FIG. 6), the second source electrode SE' (see FIG. 6), or the second drain electrode DE' (see FIG. 6). For example, the electrode pattern layer 111a may have a triple-layered structure including Ti layer/Al layer/Ti layer.

The organic pattern layer 211a is on the second interlayer insulating layer 207 and may cover an edge of the electrode pattern layer 111a. The organic pattern layer 211a may have an opening that exposed a center portion of the electrode pattern layer 111a. In an embodiment, the organic pattern layer 211a may have the same layered structure and include the same material as those of the first organic insulating layer 211. Such above organic pattern layer 211a may generate a step between an upper surface and a bottom surface of the second stack structure 620 (see FIG. 17).

The second stack structure 620 may cover an upper surface of the organic pattern layer 211a, an internal surface of the organic pattern layer 211a in the direction to the opening, and an upper surface of the electrode pattern layer 111a, which is exposed by the opening of the organic pattern layer 211a.

Figure 17:
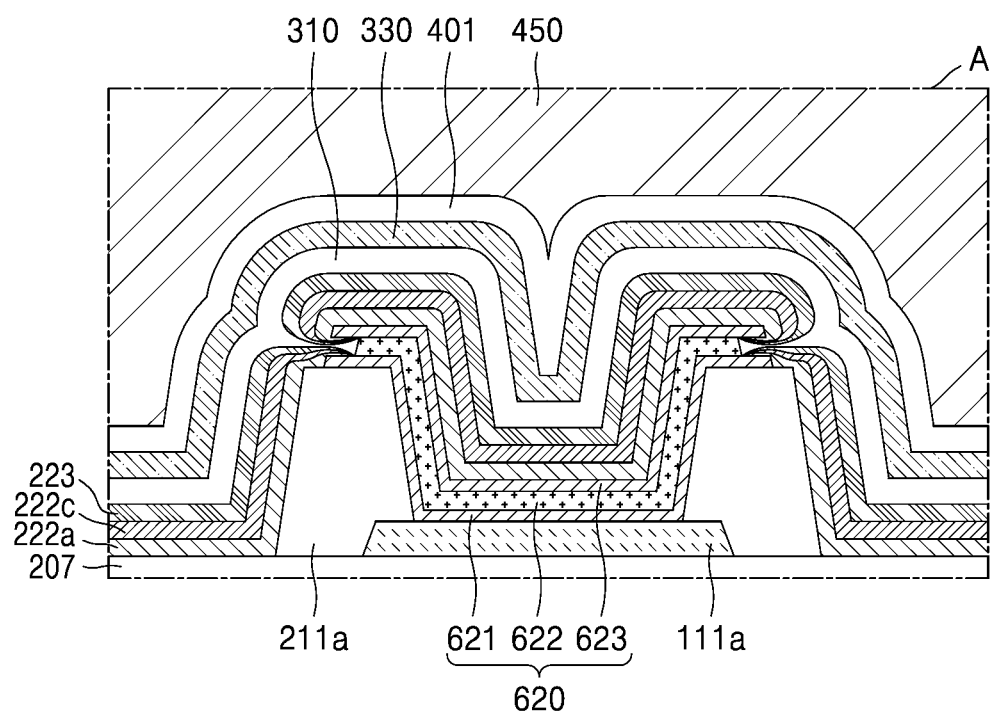
FIG. 17 is a cross-sectional view partially showing a disconnection portion according to an embodiment.
Figure 18A:
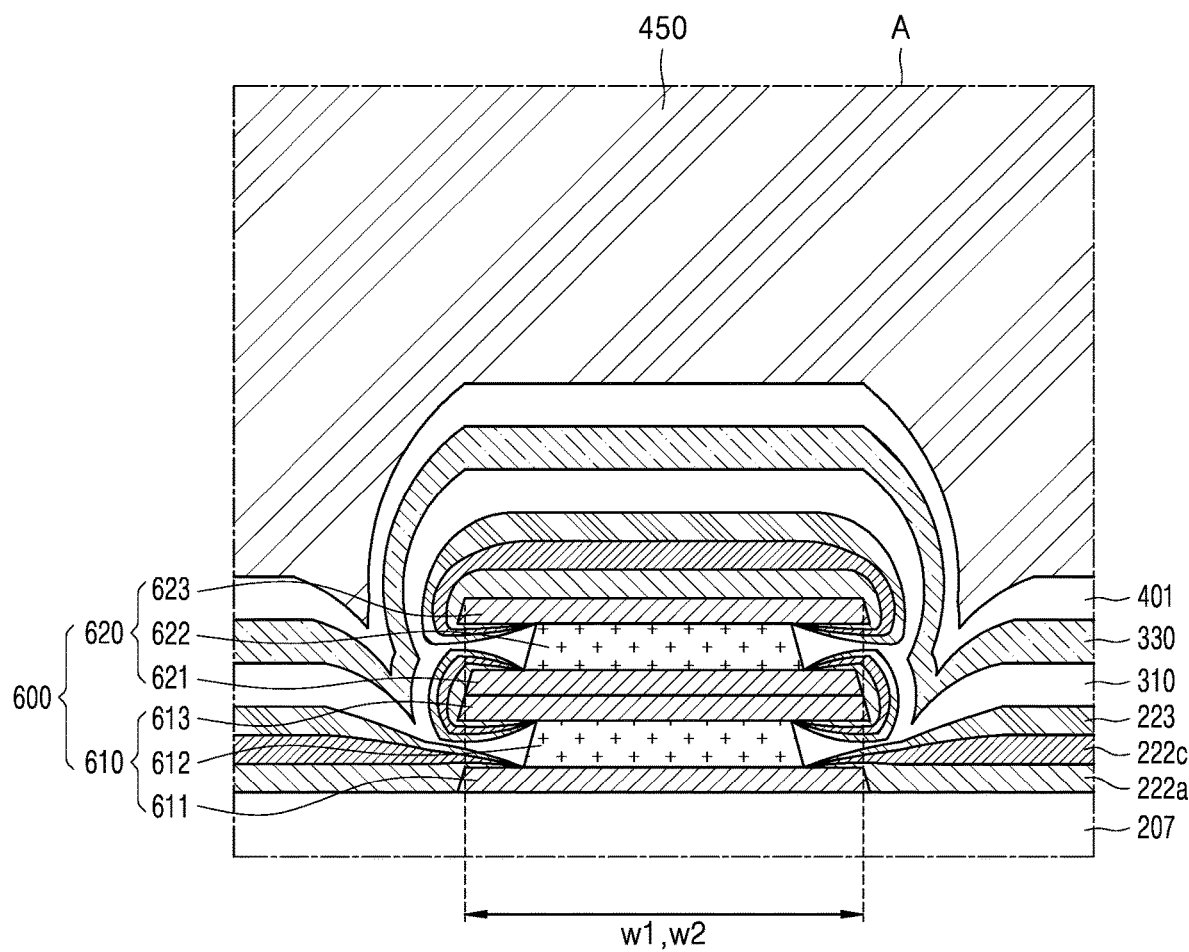
FIG. 18A is a cross-sectional view partially showing a disconnection portion according to another embodiment.
Figure 18B:
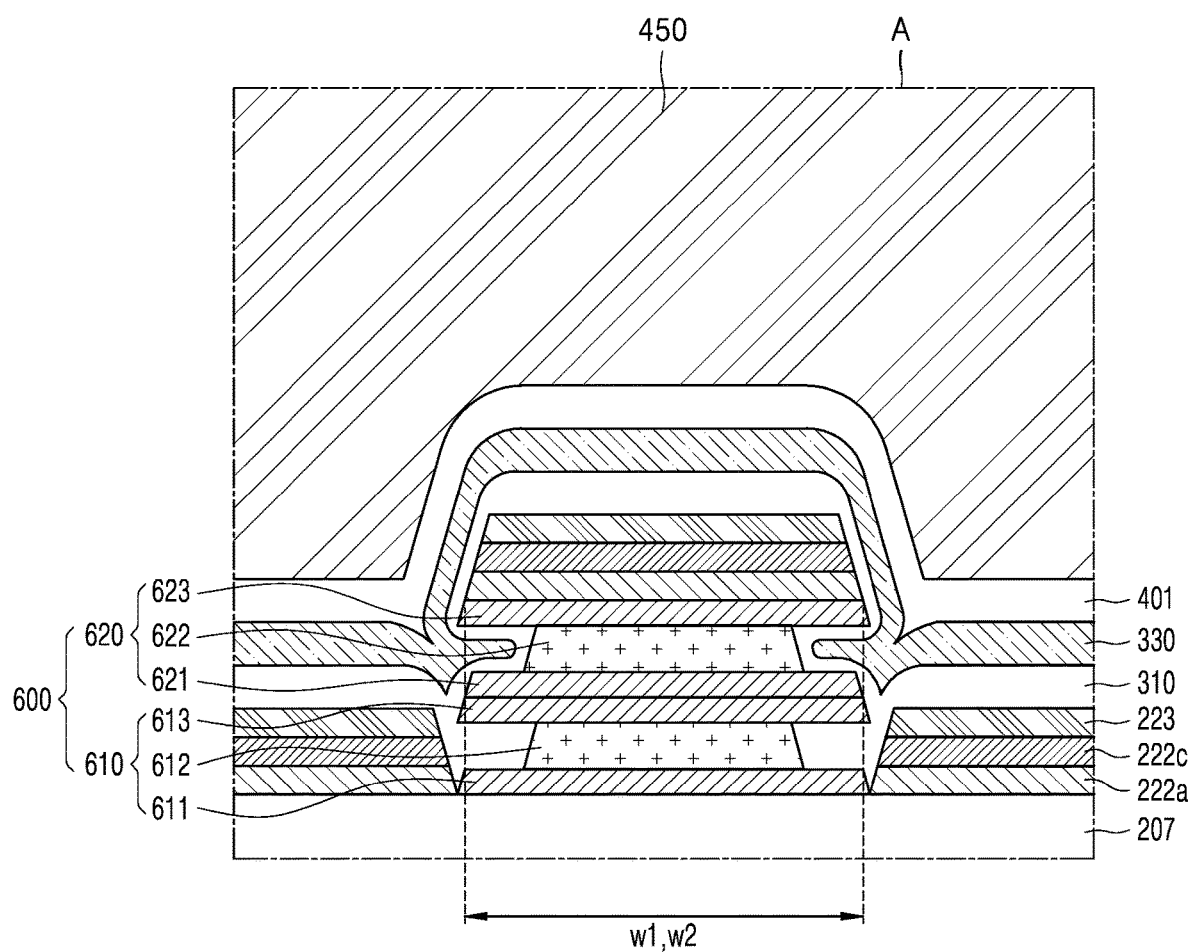
FIG. 18B is a cross-sectional view partially showing a disconnection portion according to another embodiment.

FIG. 17 is a cross-sectional view showing a region of the disconnection portion 600 according to an embodiment, FIG. 18A is a cross-sectional view showing a region of the disconnection portion 600 according to another embodiment, and FIG. 18B is a cross-sectional view showing a region of the disconnection portion 600 according to another embodiment. FIGS. 17, 18A, 18B, 19, 20, 21, and 22 are enlarged views of region A in FIG. 16.

Each of the stack structures may have a shape that may disconnect a part of the intermediate layer 222 and/or the opposite electrode 223 covering the disconnection portion 600. In detail, each of the stack structures may have concave portions in a side surface in the direction toward the opening area OA and a side surface opposite to the opening area OA.

In an embodiment, the disconnection portion 600 may have at least one of the first stack structure 610, in which a 1-1st sub-layer 611, a 1-2nd sub-layer 612, and a 1-3rd sub-layer 613 are sequentially stacked, and a second stack structure 620, in which a 2-1st sub-layer 621, a 2-2nd sub-layer 622, and a 2-3rd sub-layer 623 are sequentially stacked. The second stack structure 620 may be on the first stack structure 610.

Referring to FIGS. 17, 18A, and 18B, the first stack structure 610 may have a first concave portion that is formed by denting the 1-2nd sub-layer 612 toward the center of the 1-2nd sub-layer 612. The 1-1st sub-layer 611 and the 1-3rd sub-layer 613 may further protrude than the 1-2nd sub-layer 612 in the direction toward the opening area OA and the direction opposite to the opening area OA to form the tip. In this case, a width of the 1-2nd sub-layer 612 may be less than that of the 1-1st sub-layer 611 and that of the 1-3rd sub-layer 613. Likewise, the second stack structure 620 may have a second concave portion that is formed by denting the 2-2nd sub-layer 622 toward the center of the 2-2nd sub-layer 622. The 2-1st sub-layer 621 and the 2-3rd sub-layer 623 may further protrude than the 2-2nd sub-layer 622 in the direction toward the opening area OA and the direction opposite to the opening area OA to form the tip. In this case, a width of the 2-2nd sub-layer 622 may be less than that of the 2-1st sub-layer 621 and the 2-3rd sub-layer 623.

The disconnection portion 600 may be formed by etching, e.g., the isotropic etching process, and the concave portions may be formed according to an etch ratio between the sub-layers. For example, the 1-2nd sub-layer 612 of the first stack structure 610 may include a material having faster etch rate than that of the 1-1st sub-layer 611 and the 1-3rd sub-layer 613, and thus, may be relatively more etched and depressed toward the center of the 1-2nd sub-layer 612. Likewise, the 2-2nd sub-layer 622 of the second stack structure 620 may include a material having faster etch rate than that of the 2-1st sub-layer 621 and the 2-3rd sub-layer 623, and thus, may be relatively more etched and depressed toward the center of the 2-2nd sub-layer 622. As described above, the sub-layers including the material having relative fast etch rate may be exposed during the post-process (e.g., an etching process for patterning the pixel electrode) and may be additionally etched.

In an embodiment, the first stack structure 610 may have the same stack structure and include the same material as those of the first source electrode SE (see FIG. 6), the first drain electrode DE (see FIG. 6), the second source electrode SE' (see FIG. 6), and/or the second drain electrode DE' (see FIG. 6). In detail, the first stack structure 610 may have a structure, in which the 1-1st sub-layer 611 including titanium (Ti), the 1-2nd sub-layer 612 including aluminum (Al), and the 1-3rd sub-layer 613 including titanium (Ti) are sequentially stacked. In addition, each of the first source electrode SE, the first drain electrode DE, the second source electrode SE', and/or the second drain electrode DE' may have a structure, in which a layer including the same material as that of the 1-1st sub-layer 611, a layer including the same material as that of the 1-2nd sub-layer 612, and a layer including the same material as that of the 1-3rd sub-layer 613 are sequentially stacked.

Also, the second stack structure 620 may have the same stack structure and the same material as those of the data line DL (see FIG. 6), the driving voltage line PL (see FIG. 6), and/or the contact metal layer CM (see FIG. 6). In detail, the second stack structure 620 may have a structure, in which the 2-1st sub-layer 621 including titanium (Ti), the 2-2nd sub-layer 622 including aluminum (Al), and the 2-3rd sub-layer 623 including titanium (Ti) are sequentially stacked. In addition, the contact metal layer CM may have a structure, in which a layer including the same material as that of the 2-1st sub-layer 621, a layer including the same material as that of the 2-2nd sub-layer 622, and a layer including the same material as that of the 2-3rd sub-layer 623 are sequentially stacked.

The disconnection portion 600 having the above structure may be formed before the process of forming the intermediate layer 222, and the intermediate layer 222 and the opposite electrode 223 may be obtained by a thermal deposition method. The at least one organic material layer included in the intermediate layer and/or the opposite electrode 223 may be disconnected by the disconnection portion 600 and discontinuously formed.

In an embodiment, as shown in FIG. 18A, layers having bad step coverages may have decreased thickness toward the inside of the concave portions, and may be disconnected in at least one of the concave portions. For example, because the intermediate layer 222 and/or the opposite electrode 223 extending while covering the stack structure may have inferior step coverage as compared with the first inorganic encapsulation layer 310 and the second inorganic encapsulation layer 330, thickness is reduced toward the inside of the concave portions and may be disconnected and discontinuously formed in at least one of the concave portions. For example, each of the intermediate layer 222 and/or the opposite electrode 223 may have a thickness that is gradually reduced and then disconnected toward the inside of the first concave portion of the first stack structure 610 or the inside of the second concave portion of the second stack structure 620. In addition, the first inorganic encapsulation layer 310, the second inorganic encapsulation layer 330, and the first touch insulating layer 401 having relatively excellent step coverage may be continuously formed along the shape of the disconnection portion 600.

In another embodiment, as shown in FIG. 18B, the intermediate layer 222 and/or the opposite electrode 223 may be disconnected by the tips at upper and lower portions of the concave portion. For example, referring to FIG. 18B, the intermediate layer 222 and the opposite electrode 223 cover the upper surface of the disconnection portion 600 and may be disconnected and discontinuously formed due to the tips at opposite ends of the upper surface of the disconnection portion 600. In addition, the first inorganic encapsulation layer 310, the second inorganic encapsulation layer 330, and the first touch insulating layer 401 having relatively excellent step coverage may be continuously formed along the shape of the disconnection portion 600.

Hereinafter, FIGS. 19, 20, 21, and 22 show a case in which the layers having bad step coverage have a thickness that is reduced toward the inside of the concave portions and are disconnected inside at least one of the concave portions as shown in FIG. 18A, but the layers covering the disconnection portion 600 may be formed as shown in FIG. 18B in structures that will be described later.

Figure 19:
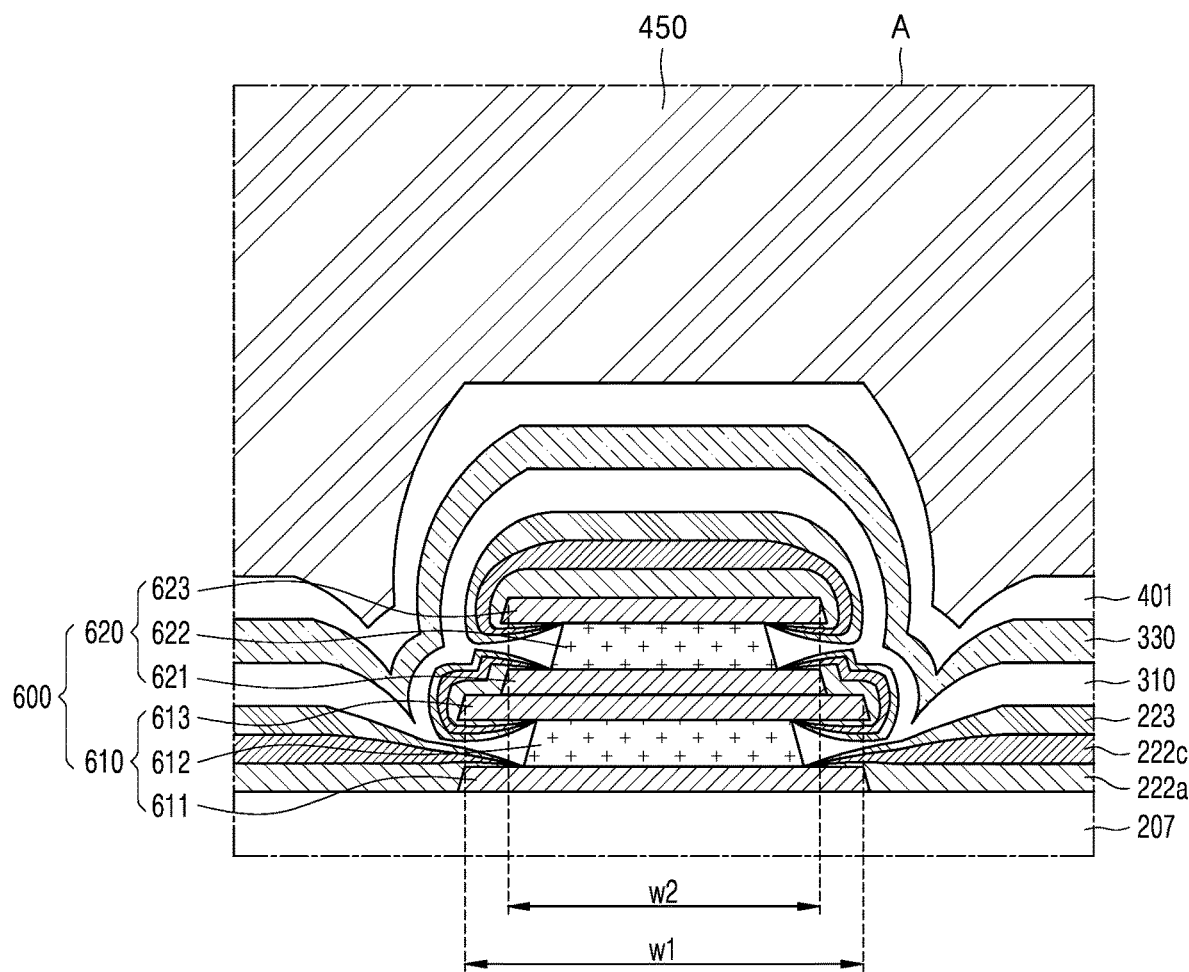
FIG. 19 is a cross-sectional view partially showing a disconnection portion according to another embodiment.

FIG. 19 is a cross-sectional view partially showing the disconnection portion 600 according to another embodiment. The embodiment as shown in FIG. 19 is only different from that of FIG. 18A in view of widths of the stack structures.

In the embodiment illustrated in FIG. 18A, a width w1 of the first stack structure 610 is equal to a width w2 of the second stack structure 620, but one or more embodiments are not limited thereto. Here, the width w1 of the first stack structure 610 denotes a width of the upper surface of the 1-1st sub-layer 611 and a width of the upper surface of the 1-3rd sub-layer 613, and the width w2 of the second stack structure 620 may denote a width of the upper surface of the 2-1st sub-layer 621 and a width of the upper surface of the 2-3rd sub-layer 623. For example, as shown in FIG. 19, the width w2 of the second stack structure 620 may be less than the width w1 of the first stack structure 610. In addition, unlike the example shown in FIG. 9, the width w2 of the second stack structure 620 may be greater than the width w1 of the first stack structure 610.

Figure 20:
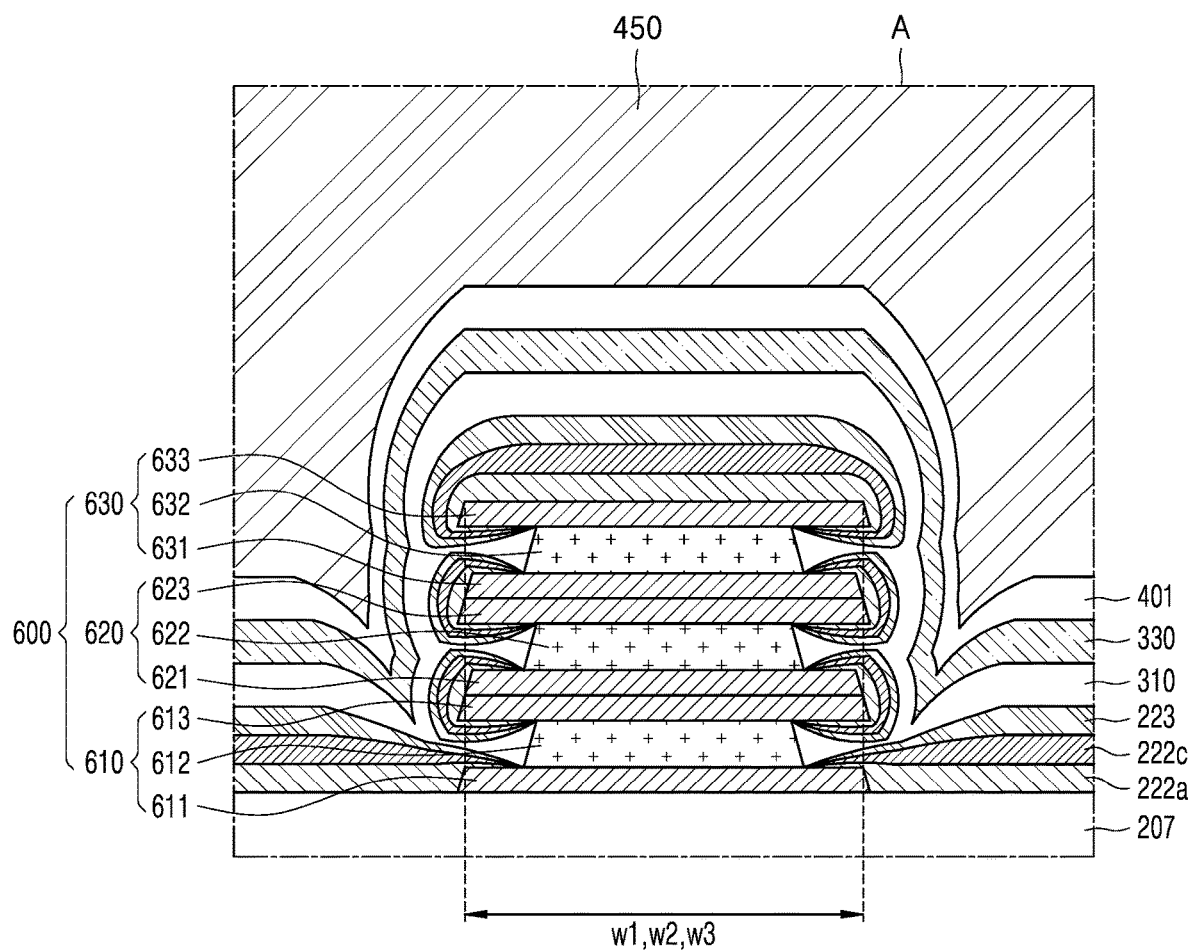
FIG. 20 is a cross-sectional view partially showing a disconnection portion according to another embodiment.
Figure 21:
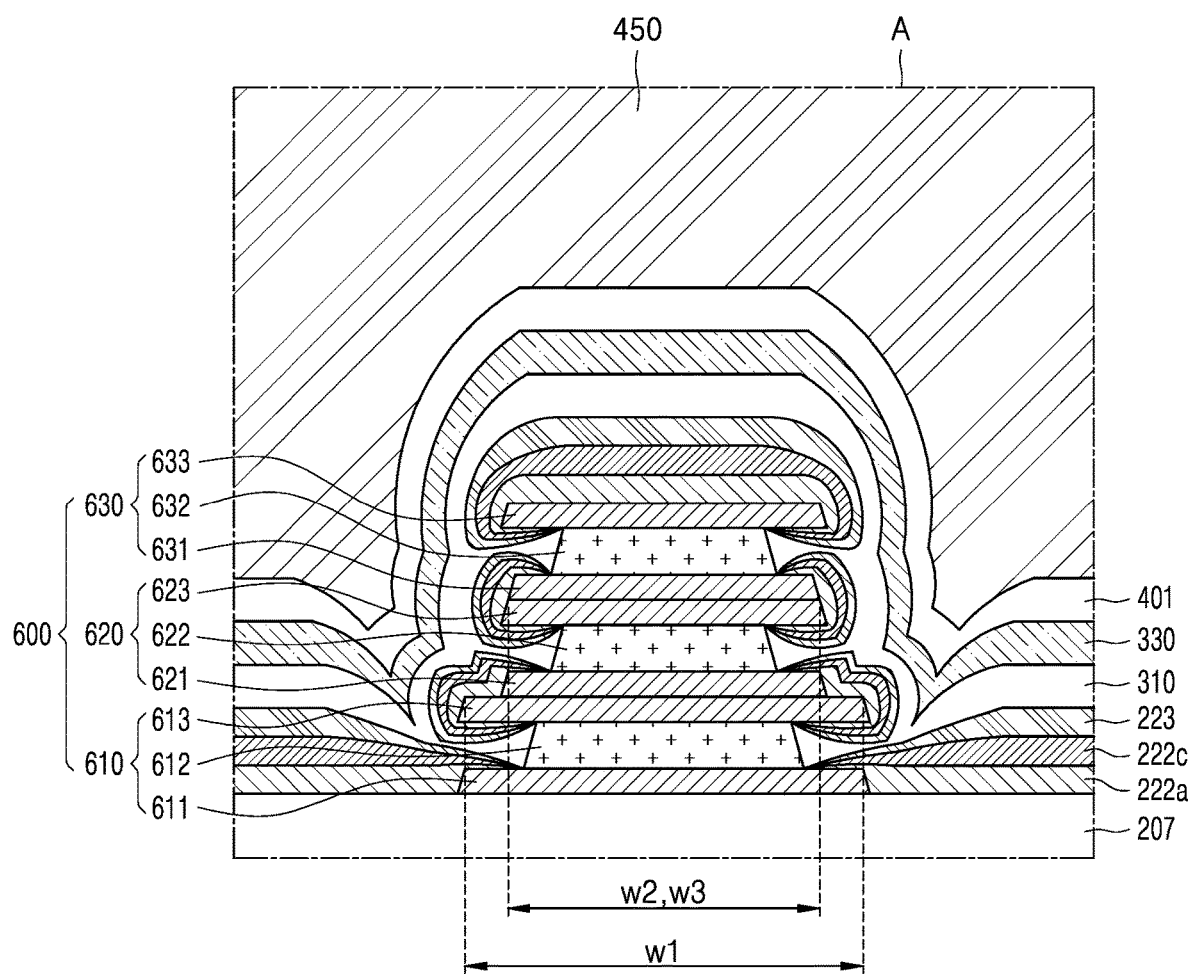
FIG. 21 is a cross-sectional view partially showing a disconnection portion according to another embodiment.
Figure 22:
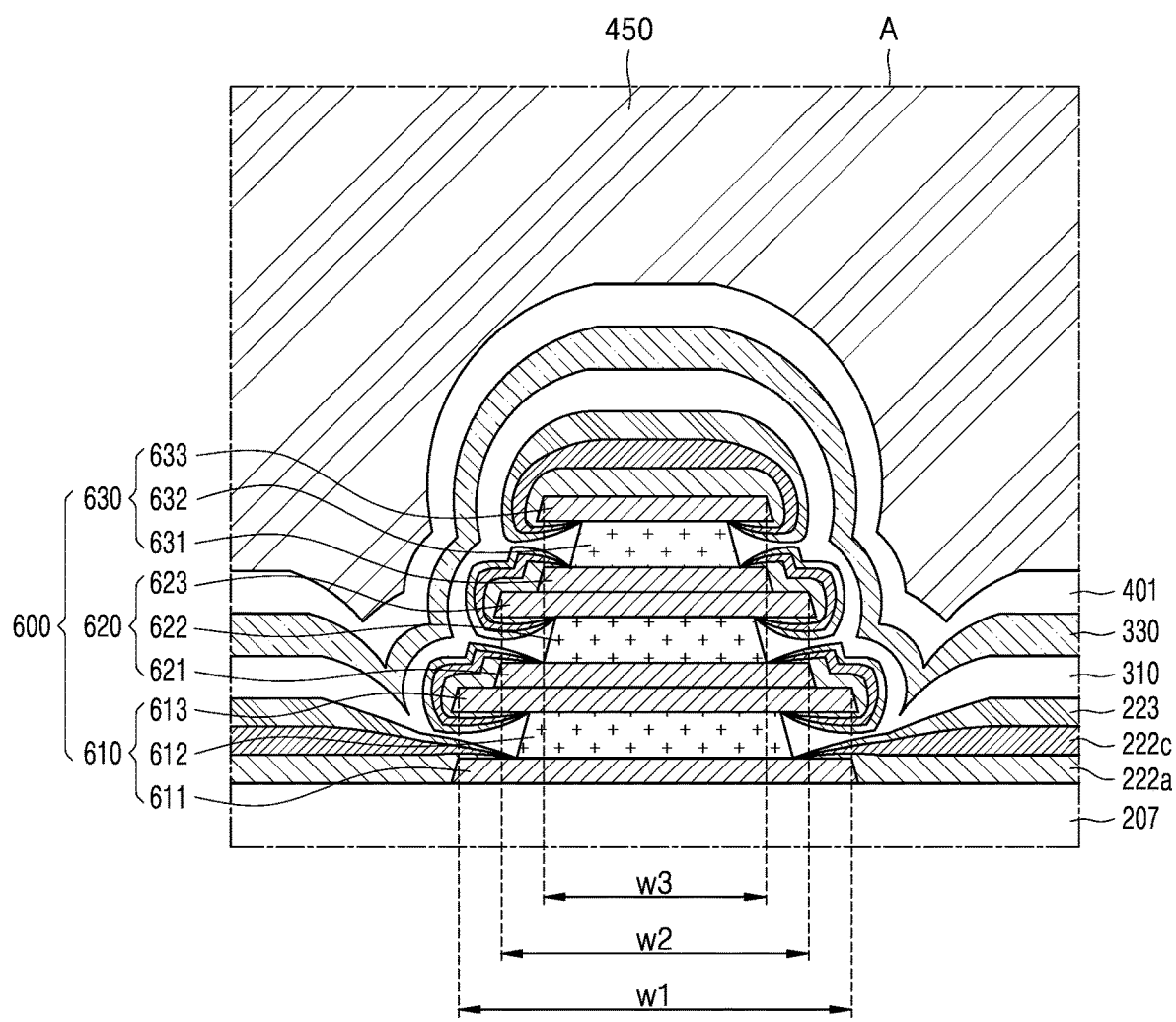
FIG. 22 is a cross-sectional view partially showing a disconnection portion according to another embodiment.

FIGS. 20, 21, and 22 are cross-sectional views a region of the disconnection portion 600 according to one or more embodiments. In detail, FIGS. 20, 21, and 22 are cross-sectional views showing a region of the disconnection portion 600 further including a third stack structure 630.

As shown in FIGS. 20, 21, and 22, the disconnection portion 600 may include the first stack structure 610 on the substrate 100 (see FIG. 6), the second stack structure 620 on the first stack structure 610, and the third stack structure 630 on the second stack structure 620. The third stack structure 630 may include a 3-1st sub-layer 631, a 3-2nd sub-layer 632, and a 3-3rd sub-layer 633 that are sequentially stacked.

The third stack structure 630 may have a third concave portion that is obtained by denting the 3-2nd sub-layer 632 toward the center thereof, similarly to the first stack structure 610 and the second stack structure 620. Descriptions about structural characteristics and effects of the first concave portion in the first stack structure 610 and the second concave portion in the second stack structure 620 are applied to the third concave portion.

According to the embodiment, the intermediate layer 222 and/or the opposite electrode 223 may each have a thickness that is gradually reduced and then disconnected toward the inside of the first concave portion of the first stack structure 610, the inside of the second concave portion of the second stack structure 620, or the inside of the third concave portion of the third stack structure 630. As described above, when the disconnection portion 600 further includes the third stack structure 630, the number of concave portions increases, and thus, the intermediate layer 222 and/or the opposite electrode 223 may be effectively disconnected.

In an embodiment, the third stack structure 630 may have the same stack structure and the same material as those of the pixel electrode 221 (see FIG. 6). In detail, the third stack structure 630 may have a structure, in which the 3-1st sub-layer 631 including ITO, the 3-2nd sub-layer 632 including argentum (Ag), and the 3-3rd sub-layer 633 including ITO are sequentially stacked. In addition, the contact metal layer CM may have a structure, in which a layer including the same material as that of the 3-1st sub-layer 631, a layer including the same material as that of the 3-2nd sub-layer 632, and a layer including the same material as that of the 3-3rd sub-layer 633 are sequentially stacked.

In addition, as shown in FIG. 20, the width w1 of the first stack structure 610, the width w2 of the second stack structure 620, and a width w3 of the third stack structure 630 may be equal to one another, but are not limited thereto. For example, as shown in FIG. 21, the width w2 of the second stack structure 620 and the width w3 of the third stack structure 630 may be less than the width w1 of the first stack structure 610. In addition, as shown in FIG. 22, the width w3 of the third stack structure 630 may be less than the width w2 of the second stack structure 620, and the width w2 of the second stack structure 620 may be less than the width w1 of the first stack structure 610.

The display apparatus has been described, but one or more embodiments of the disclosure are not limited thereto. For example, a method of manufacturing the display apparatus may be also included in the scope of the disclosure.

According to one or more embodiments of the disclosure, the display apparatus having an improved performance of preventing moisture infiltration may be implemented. However, the scope of one or more embodiments is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate including a display area and a middle area, wherein an opening is defined in the substrate, the display area surrounds the opening, and the middle area is disposed between the opening and the display area;
a light-emitting device disposed in the display area, the light-emitting device including a pixel electrode, an opposite electrode, and an intermediate layer disposed between the pixel electrode and the opposite electrode;
an encapsulation layer covering the light-emitting device, the encapsulation layer including at least one inorganic encapsulation layer;
a first groove disposed in the middle area, the first groove disposed on the substrate; and
a second groove disposed in the middle area, the second groove having an undercut shape that is concave in a thickness direction of a multi-layered film in the substrate,
wherein the first groove comprises a first bottom surface and the second groove comprises a second bottom surface, and
wherein the first bottom surface is disposed on a different layer than the second bottom surface.

2. A display panel, comprising:
a substrate including a display area and a middle area, wherein an opening is defined in the substrate, the display area surrounds the opening, and the middle area is disposed between the opening and the display area;
a light-emitting device disposed in the display area, the light-emitting device including a pixel electrode, an opposite electrode, and an intermediate layer disposed between the pixel electrode and the opposite electrode;
an encapsulation layer covering the light-emitting device, the encapsulation layer including at least one inorganic encapsulation layer;
a first groove disposed in the middle area, the first groove disposed on the substrate; and
a second groove disposed in the middle area, the second groove having an undercut shape that is concave in a thickness direction of a multi-layered film in the substrate,
wherein the first groove includes:
a 1-1st hole in an inorganic insulating layer on the substrate; and
a 1-2nd hole in an organic insulating layer on the inorganic insulating layer, and
wherein the 1-2nd hole is connected to the 1-1st hole.

3. The display panel of claim 2, wherein the first groove includes a first tip that protrudes from a metal pattern layer disposed on the organic insulating layer toward a center of the first groove.

4. The display panel of claim 3, wherein an organic material layer included in the intermediate layer or the opposite electrode is disconnected by the first tip.

5. The display panel of claim 3, wherein the at least one inorganic encapsulation layer continuously covers an inner surface and a lower surface of the metal pattern layer and an inner surface of the organic insulating layer.

6. The display panel of claim 3, wherein the first tip has a multi-layered structure, in which a first layer, a second layer, and a third layer are sequentially stacked, and a concave portion that is obtained by denting the second layer in a direction away from the center of the first groove, and
an organic material layer included in the intermediate layer or the opposite electrode is disconnected by the multi-layered structure.

7. The display panel of claim 1, further comprising a lower layer disposed under the first groove, the lower layer having an upper surface corresponding to the first bottom surface of the first groove.

8. The display panel of claim 1, further comprising metal dummy stacks at opposite sides of the first groove based on a line that passes through the center of the first groove and is perpendicular to an upper surface of the substrate, the metal dummy stacks each including one or more metal layers stacked with an insulating layer therebetween.

9. The display panel of claim 1, wherein the multi-layered film included in the substrate includes a base layer and a barrier layer disposed on the base layer.

10. The display panel of claim 9, wherein the second groove includes:
a 2-1st hole or a 2-1st recess in the base layer; and
a 2-2nd hole in the barrier layer,
wherein the 2-2nd hole is connected to the 2-1st hole or the 2-1st recess.

11. The display panel of claim 10, wherein the second groove includes a second tip that is a protrusion from the barrier layer toward a center of the second groove.

12. The display panel of claim 11, wherein an organic material layer included in the intermediate layer or the opposite electrode is disconnected by the second tip.

13. The display panel of claim 11, wherein the at least one inorganic encapsulation layer continuously covers an inner surface and a lower surface of the barrier layer and an inner surface of the base layer.

14. The display panel of claim 1, further comprising a disconnection portion in the middle area, and having at least one of a first stack structure, in which a 1-1st sub-layer, a 1-2nd sub-layer, and a 1-3rd sub-layer are sequentially stacked, and a second stack structure on the first stack structure, the second stack structure including a 2-1st sub-layer, a 2-2nd sub-layer, and a 2-3rd sub-layer sequentially stacked,
wherein an organic material layer included in the intermediate layer or the opposite electrode is disconnected by the disconnection portion.

15. The display panel of claim 14, wherein the first stack structure has a first concave portion formed by denting the 1-2nd sub-layer toward a center thereof, and
the second stack structure has a second concave portion formed by denting the 2-2nd sub-layer toward a center thereof.

16. The display panel of claim 14, further comprising a thin film transistor disposed on the substrate, the thin film transistor including a semiconductor layer, a gate electrode overlapping the semiconductor layer, and a source electrode and a drain electrode electrically connected to the semiconductor layer,
wherein each of the source electrode and the drain electrode has a structure, in which a layer having a material same as a material in the 1-1st sub-layer, a layer having a material same as a material in the 1-2nd sub-layer, and a layer having a material same as a material in the 1-3rd sub-layer are sequentially stacked.

17. The display panel of claim 16, further comprising a contact metal layer on the thin film transistor, the contact metal layer being electrically connected to the source electrode or the drain electrode,
- wherein the contact metal layer has a structure, in which a layer having a material same as a material in the 2-1st sub-layer, a layer having a material same as a material in the 2-2nd sub-layer, and a layer having a material same as a material in the 2-3rd sub-layer are sequentially stacked.

18. The display panel of claim 14, wherein the disconnection portion further includes a third stack structure disposed on the second stack structure, the third stack structure including a 3-1st sub-layer, a 3-2nd sub-layer, and 3-3rd sub-layer sequentially stacked.

19. The display panel of claim 18, wherein the first stack structure has a first concave portion formed by denting the 1-2nd sub-layer toward a center thereof,
- the second stack structure has a second concave portion formed by denting the 2-2nd sub-layer toward a center thereof, and
- the third stack structure has a third concave portion formed by denting the 3-2nd sub-layer toward a center thereof.

20. The display panel of claim 18, wherein the pixel electrode has a structure, in which a layer having a material same as a material in the 3-1st sub-layer, a layer having a material same as a material in the 3-2nd sub-layer, and a layer having a material same as a material in the 3-3rd sub-layer are sequentially stacked.

\* \* \* \* \*